(12) United States Patent
Agrawal et al.

(10) Patent No.: US 6,348,813 B1
(45) Date of Patent: Feb. 19, 2002

(54) SCALABLE ARCHITECTURE FOR HIGH DENSITY CPLD'S HAVING TWO-LEVEL HIERARCHY OF ROUTING RESOURCES

(75) Inventors: Om P. Agrawal, Los Altos, CA (US); Claudia A. Stanley, Austin, TX (US); Xiaojie (Warren) He, Austin, TX (US); Larry R. Metzger, Austin, TX (US); Robert A. Simon, Colorado Springs, CO (US); Kerry A. Ilgenstein, Austin, TX (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 0 days.

(21) Appl. No.: 09/721,153

(22) Filed: Nov. 22, 2000

Related U.S. Application Data

(62) Division of application No. 09/326,940, filed on Jun. 6, 1999, now Pat. No. 6,184,713.

(51) Int. Cl.⁷ .......................... H03K 19/177
(52) U.S. Cl. .................. 326/41; 326/40; 326/39; 326/38
(58) Field of Search ................ 326/37, 38, 39, 326/40, 41

(56) References Cited

U.S. PATENT DOCUMENTS 6,097,212 A * 8/2000 Agrawal et al. .............. 326/41
6,150,841 A * 11/2000 Agrawal et al. .............. 326/41

\* cited by examiner

*Primary Examiner*—Michael Tokar
*Assistant Examiner*—Vibol Tan
(74) *Attorney, Agent, or Firm*—Fliesler, Dubb, Meyer & Lovejoy LLP; Gideon Gimlan

(57) ABSTRACT

An improved, scalable CPLD device has a two-tiered hierarchical switch construct comprised of a Global Switch Matrix (GSM) and an even number of Segment Switch Matrices (SSM's). An even number of Super Logic Blocks (SLB's) are coupled to each SSM. Each SSM and its SLB's define a segment that couples to the GSM. Each SLB has a relatively large number of inputs (at least 80) and can generate product term signals (PT's) that are products of independent input terms provided from the SSM to the SLB inputs. Some of the product terms generated within each SLB are dedicated to SLB-local controls. Each SLB has at least 32 macrocells and at least 16 I/O pads which feedback to both to the local SSM and the global GSM. 100% intra-segment connectivity is assured within each segment so that each segment can function as an independent, mini-CPLD. Each SSM has additional lines, dedicated for inter-segment (global) communications. The large number of parallel inputs to each SLB ease implementation of 64-bit wide designs. Symmetry within the design of each segment allow for more finely-granulated implementations such as for 32 or 16-bit wide designs.

16 Claims, 16 Drawing Sheets

400
LEGEND

401

402

403

404

SCALABLE ARCHITECTURE FOR HIGH DENSITY CPLD'S HAVING TWO-LEVEL HIERARCHY OF ROUTING RESOURCES

This application is a Div. of Ser. No. 09/326,940, filed Jun. 6, 1999, now U.S. Pat. No. 6,184,713.

BACKGROUND

1. Field of Invention

The invention is generally directed to monolithic integrated circuits, and more specifically to a scalable architecture for use within Programmable Logic Devices (PLD's). It is even more specifically directed to a subclass of PLD's known as High-Density Complex Programmable Logic Devices (HCPLD's).

2. Cross Reference to Related Patents

The disclosures of the following U.S. patents are incorporated herein by reference:

(A) U.S. Pat. No. 5,764,078 issued Jun. 9, 1998 to Om Agrawal et al, and entitled, FAMILY OF MULTIPLE SEGMENTED PROGRAMMABLE LOGIC BLOCKS INTERCONNECTED BY A HIGH SPEED CENTRALIZED SWITCH MATRIX;

(B) U.S. Pat. No. 5,811,986 issued Sep. 22, 1998 to Om Agrawal et al, and entitled, FLEXIBLE SYNCHRONOUS/ASYNCHRONOUS CELL STRUCTURE FOR HIGH DENSITY PROGRAMMABLE LOGIC DEVICE;

(C) U.S. Pat. No. 5,818,254 issued Oct. 6, 1998 to Om Agrawal et al, and entitled, MULTI-TIERED HIERARCHICAL HIGH SPEED SWITCH MATRIX STRUCTURE FOR VERY HIGH DENSITY COMPLEX PROGRAMMABLE LOGIC DEVICES;

(D) U.S. Pat. No. 5,789,939 issued Aug. 4, 1998 to Om Agrawal et al, and entitled, METHOD FOR PROVIDING A PLURALITY OF HIERARCHICAL SIGNAL PATHS IN A VERY HIGH DENSITY PROGRAMMABLE LOGIC DEVICE;

(E) U.S. Pat. No. 5,621,650 issued Apr. 15, 1997 to Om Agrawal et al, and entitled, PROGRAMMABLE LOGIC DEVICE WITH INTERNAL TIME-CONSTANT MULTIPLEXING OF SIGNALS FROM EXTERNAL INTERCONNECT BUSES; and (F) U.S. Pat. No. 5,185,706 issued Feb. 9, 1993 to Om Agrawal et al.

3. Description of Related Art

Field-Programmable Logic Devices (FPLD's) have continuously evolved to better serve the unique needs of different end-users. From the time of introduction of simple PLD's such as the Advanced Micro Devices 22V10™ Programmable Array Logic device (PAL), the art has branched out in several different directions.

One evolutionary branch of FPLD's has grown along a paradigm known as Field Programmable Gate Arrays or FPGA's. Examples of such devices include the XC2000™ and XC3000™ families of FPGA devices introduced by Xilinx, Inc. of San Jose, Calif. The architectures of these devices are exemplified in U.S. Pat. Nos. 4,642,487; 4,706,216; 4,713,557; and 4,758,985; each of which is originally assigned to Xilinx, Inc.

An FPGA may be generally characterized as a monolithic, integrated circuit that has an array of user-programmable, lookup tables (LUT's) that can each implement any Boolean function to the extent allowed by the address space of the LUT. User-programmable interconnect is typically provided for interconnecting primitive, LUT-implemented functions and for thereby defining more complex functions.

Because LUT-based function implementation tends to be functionally more exhaustive (broader) but speed-wise slower than gate-based (e.g., AND/OR-based) function implementation, FPGA's are generally recognized in the art as having a relatively expansive capability of implementing a wide variety of functions (broad functionality) but at relatively slow speed. Also, because length of signal routings through the programmable interconnect of an FPGA can vary significantly, FPGA's are generally recognized as providing relatively inconsistent signal delays whose values can vary substantially depending on how partitioning, placement and routing software configures the FPGA.

A second evolutionary chain in the art of field programmable logic has branched out along a paradigm known as Complex PLD's or CPLD's. This paradigm is characterized by devices such as the Vantis (subsidiary of Advanced Micro Devices Inc.) MACH™ family. Examples of CPLD circuitry are seen in U.S. Pat. No. 5,015,884 (issued May 14, 1991 to Om P. Agrawal et al.) and U.S. Pat. No. 5,151,623 (issued Sep. 29, 1992 to Om P. Agrawal et al.) as well as in other CPLD patents cited above.

A CPLD device can be characterized as a monolithic, integrated circuit (IC) that has four major features as follows.

(1) A user-accessible, configuration-defining memory means, such as EPROM, EEPROM, anti-fused, fused, SRAM, or other, is provided in the CPLD device so as to be at least once-programmable by device users for defining user-provided configuration instructions. Static Random Access Memory or SRAM is of course, a form of reprogrammable memory that can be differently programmed many times. Electrically Erasable and reProgrammable ROM or EEPROM is an example of nonvolatile reprogrammable memory. The configuration-defining memory of a CPLD device can be formed of a mixture of different kinds of memory elements if desired (e.g., SRAM and EEPROM). Typically it is of the nonvolatile, In-System reprogrammable (ISP) kind such as EEPROM.

(2) Input/Output means (IO's) are provided for interconnecting internal circuit components of the CPLD device with external circuitry. The IO's may have fixed configurations or they may include configurable features such as variable slew-output drivers whose characteristics may be fine tuned in accordance with user-provided configuration instructions stored in the configuration-defining memory means.

(3) Programmable Logic Blocks (PLB's) are provided for carrying out user-programmed logic functions as defined by user-provided configuration instructions stored in the configuration-defining memory means. Typically, each of the many PLB's of a CPLD has at least a Boolean sum-of-products generating circuit (e.g., and AND/OR array) or a Boolean product-of-sums generating circuit (e.g., and OR/AND array) that is user-configurable to define a desired Boolean function, —to the extent allowed by the number of product terms (PT's) or sum terms that are combinable by that circuit.

Each PLB may have other resources such as input signal pre-processing resources and output signal post-processing resources. The output signal post-processing resources may include result storing and/or timing adjustment resources such as clock-synchronized registers. Although the term 'PLB' was adopted by early pioneers of CPLD technology, it is not uncommon to see other names being given to the repeated portion of the CPLD that carries out user-programmed logic functions and timing adjustments to the resultant function signals.

(4) An interconnect network is generally provided for carrying signal traffic within the CPLD between various PLB's and/or between various IO's and/or between various IO's and PLB's. At least part of the interconnect network is typically configurable so as to allow for programmably-defined routing of signals between various PLB's and/or IO's in accordance with user-defined routing instructions stored in the configuration-defining memory means. Another part of the interconnect network may be hard wired or nonconfigurable such that it does not allow for programmed definition of the path to be taken by respective signals traveling along such hard wired interconnect.

In contrast to LUT-based FPGA's, gate-based CPLD's are generally recognized in the art as having a relatively less-expansive capability of implementing a wide variety of functions (in other words, not being able to implement all Boolean functions for a given input space) but being able to do so at relatively higher speeds. In other words, very wide functionality is sacrificed to obtain shorter, pin-to-pin signal delays. Also, because length of signal routings through the programmable interconnect of a CPLD is often arranged so it will not vary significantly despite different signal routings, CPLD's are generally recognized as being able to provide relatively consistent signal delays whose values do not vary substantially based on how partitioning, placement and routing software configures the CPLD. Many devices in the Vantis MACH™ family provide such a consistent signal delay characteristic under the Vantis trade name of Speed-Locking™. The more generic term, Speed-Consistency will be used interchangeably herein with the term, SpeedLocking™.

A newly evolving sub-branch of the growing families of CPLD devices is known as High-Density Complex Programmable Logic Devices (HCPLD's). This sub-branch may be generally characterized as monolithic IC's that have large numbers of I/O terminals (e.g., Input/Output pins) in the range of about 64 or more (e.g., 96, 128, 192, 256, 320, etc.) and/or have large numbers of result-storing macrocells in the range of about 256 or more (e.g., 320, 512, 1024, etc.). The process of concentrating large numbers of I/O pins and/or large numbers of macrocells into a single CPLD IC raises new challenges for achieving relatively broad functionality, high speed, and Speed-Consistency (SpeedLocking™) in the face of wide varieties of configuration software.

Configuration software can produce different results, good or bad, depending in part on what broadness of functionalities, what routing flexibilities and what timing flexibilities are provided by the architecture of the target CPLD. Modern CPLD's typically offer a large spectrum of user-configurable options with respect to how each of many PLB's can be configured, how each of many interconnect resources can be configured, and how each of many IO's can be used and/or configured. Rather than determining with pencil and paper how each of the configurable resources of a CPLD should be programmed, it is common practice to employ a computer and appropriate CPLD-configuring software to automatically generate the configuration instruction signals that will be supplied to, and that will cause an unprogrammed CPLD to implement a specific design.

CPLD-configuring software typically cycles through a series of phases that are referred to commonly as 'fitting'. These phases may also be referred to as 'partitioning', 'placement', and 'routing'. The fitting software is sometimes referred to as a 'place and route' program. Alternate names of software tools that operate at a more global level may include, 'synthesis, mapping and optimization tools'.

In the partitioning phase, an original circuit design (which is usually relatively large and complex) is divided into smaller chunks, where each chunk is made sufficiently small to be implemented within a single PLB (where such a PLB typically includes one or more AND/OR arrays). During the partitioning phase, the resources of each PLB remain as those of a yet-unspecified one of the many PLB's that are available in the yet-unprogrammed CPLD device. It is during placement that physical locations and groupings are assigned to partitioned chunks.

Differently designed CPLD's can have differently designed PLB's with respectively different, logic-implementing capabilities and timing capabilities. As such, the maximum size that will be allowed for partitioned chunk can vary in accordance with the specific CPLD device that is designated to implement the original circuit design.

By way of example, each PLB of a given, first CPLD architecture may be able to generate in one pass (where the one pass does not include the use of a feedback loop) a sum-of-products (SoP) function signal of the expressive form:

$$f_{SoP} = \Sigma^N (PT_i^{Ki/Kmax/L}) \qquad \{Exp. A\}.$$

In this sum-of-products expression (Exp. A), the N factor represents a maximum number of product terms (PT's) that can be generated and thereafter summed by a respective PLB for defining the one sum-of-products function signal, $f_{SoP}$. The Kmax factor represents in the same expression, Exp. A, a maximum number of independent, PLB input signals that can be acquired from a set of L available lines. Ki is the number of actual signals that are used as a subset of Kmax for defining a corresponding, i-th product term, PTi. The acquired subset of Ki signals are ANDed together in the respective PLB to define each respective, i-th product term (PTi). If Ki=0, then PTi=0 and that PTi therefore does not contribute to the Boolean sum.

By way of a more concrete example, consider a PLB of a given first CPLD architecture where each sum-of-products can have a maximum of 3 PT's, with each PT being a product of no more than 16 input terms, where the input terms are sampled from 64 nearby lines. Such a PLB may therefore be able to generate in one pass, a first SoP function of the expressive form:

$$f_{SoP1} \Sigma^3 (PT_i^{Ki/16\_max/fm\_64-Lines}) \qquad \{Exp. A1\}$$

Consider also, for purposes of contrast, a PLB of a given second, and differently designed, CPLD architecture where each sum-of-products can have a maximum of 4 PT's, with each PT being a product of no more than 32 input terms, where the input terms are sampled from 96 nearby lines. Such a PLB may therefore be able to generate in one pass, a second SoP function of the expressive form:

$$f_{SoP2} = \Sigma^4 (PT_i^{Ki/32\_max/fm\_96\_Lines}) \qquad \{Exp. A2\}.$$

In other words, due to architectural constraints, it is possible that the one-pass, sum-of-products result ($f_{SoP1}$=PT$_1$+PT$_2$+PT$_3$, see Exp. A1) of a PLB in the first CPLD architecture can be no more complex than a sum of three independent product terms (3 PT's), where each such PTi is no more complex than a product of no more than sixteen (16) independent, PLB term input signals that are sampled out of an available and larger set of sixty-four (64) independent signals.

In contrast, and again due to architectural variations, the one-pass, sum-of-products result ($f_{SoP2}$=PT$_1$+PT$_2$+PT$_3$+PT$_4$, see Exp. A2) of a PLB in the second CPLD architecture can be as complex as a sum of four independent product terms (4 PT's) where each such PTi is as complex as a product of up to 32 independent, PLB term input signals that are sampled by multiplexing from an available and nearby set of 96 independent signals. The 1-out-of-3 sampling ratio, 32 max/96 that is implied in expression Exp. A2 is an input multiplexing factor of the PLB. It shows that the PLB has only 32 input lines whose maximum of 32 input signals are sampled from a nearby array of 96, signal broadcasting lines. At least three such PLB's would be needed to sample all 96 of the broadcast signals. But no one PLB can, in a single pass (a single time slice that does not use feedback), generate a function signal that represents a function of as many as all 96 of the broadcast signals.

The significance of factors such as the above N, Kmax and L and the significance of the ratio Kmax/L will become more apparent later. For now it should be understood that choice of the N, Kmax and L factors for a PLB is a matter of delicate design balance.

On the one hand, by choosing to use larger absolute values for N, Kmax and L plus larger values of the ratio, Kmax/L a CPLD designer can advantageously provide greater flexibility to the number of options that CPLD configuring software will have as it performs partitioning, placement and routing. On the other hand, if the CPLD designer arbitrarily chooses to increase the values of N, Kmax and L and to increase the ratio, Kmax/L, the designer may find that such modifications have led to excessive electrical capacitance on routing lines and excessive signal processing delays.

The reason why, is because Kmax times L defines a number of crosspoints that will be created for each PLB when the Kmax number of lines of each PLB cross with the L number of adjacent, signal broadcasting lines. The reciprocal of Kmax/L indicates the minimum number of PLB's that will be needed to fully sample all L of the adjacent signals. (L/Kmax times Kmax equals L.) Typically, the CPLD designer will want the CPLD to be able to process all L signals simultaneously (in parallel) so the designer will provide at least a L/Kmax number of PLB's. The same reciprocal ratio, L/Kmax also gives a rough indication of the extent to which the L signal broadcasting lines of the CPLD architecture will be loaded by PIP's (programmable interconnect points). The exact value of loading will depend on the extent to which each set of L times Kmax crosspoints is fully or partially-populated by PIP's.

One previous patent (U.S. Pat. No. 5,818,254 issued Oct. 6, 1998) suggests that the number of input lines per PLB (Kmax) should be kept relatively small (e.g., about 32 PLB input lines or less) and that a 3-level hierarchical switch matrix should be employed to avoid excessive signal processing delays in HCPLD's. This approach has benefits and drawbacks. On the one hand, capacitive loading is reduced for global interconnect. On the other hand, a 3-level hierarchy in the switch matrix architecture can make Speed-Locking™ problematic as one tries to migrate to higher density devices.

With the above factors in mind, we will now continue our discussion about the basics of CPLD configuring software.

The design partitioning phase needs to account for the PLB architectural factors, L, N, and Kmax because those values respectively define: (a) how many signals can be processed in parallel by the available plurality of PLB'S, (b) how many product terms can be incorporated into each sum-of-products signal, and (c) what portion of the L available signals each product term can encompass in just one pass.

Of course, for purposes of entering into the design partitioning phase, the original circuit design can be originally specified in terms of a Hardware Descriptor Language (HDL) and/or as a gate level description, or in other suitable form. Ultimately, and in one way or another, the original circuit design will have to be re-mapped into terms of sums-of-products, where such sums-of-products (SoP's) are to be implemented in respective time slots (passes) by respective ones of available PLB's and then fed forward in parallel by L lines for subsequent processing.

In order to fit its results inside the limited $f_{SoP}$ capabilities of each PLB, the design partitioning phase will have to cast its primitive sums-of-products such that they are each equal to or less than the N-defined and Kmax-defined limits of the $f_{SoP}$ results that can be produced by respective PLB's of the targeted CPLD.

If the architecture of the targeted CPLD is such that each of the above-described factors, N, Kmax and L (Exp. A) is relatively large, then the maximal $f_{SoP}$ results per PLB will tend to be relatively large and the design partitioning phase will be advantageously allowed to work with larger-sized, partition chunks. However signal delay may become excessive if N, Kmax and L are too large.

On the other hand, if the architecture of the targeted CPLD is such that each of the above-described factors, N, Kmax and L (Exp. A) is relatively small, then the maximal $f_{SoP}$ results per PLB will tend to be relatively small and the design partitioning phase will be disadvantageously forced to work with comparably, smaller-sized partition chunks and a larger number of interconnect lines. Signal delay may be more or less of a problem because of this. However, one thing will be generally true. As the partitioning phase is forced to produce larger and larger numbers of decreasing-in-size chunks, more work is disadvantageously created for the next-described, placement and routing phases of the CPLD configuring software because they have to process more data objects.

After the partitioning phase is carried out, each resulting chunk is virtually positioned ('placed') into a specific, chunk-implementing PLB of the designated CPLD during a subsequent placement phase.

In the ensuing routing phase, an attempt is made to algorithmically establish connections between the various chunk-implementing PLB's of the CPLD device, using the interconnect resources (the L lines) of the designated CPLD device. The goal is to reconstruct the functionality of the original circuit design by appropriately connecting all the partitioned and placed chunks.

If all goes well in the partitioning, placement, and routing phases, the CPLD configuring software will find a workable 'solution' comprised of a specific partitioning of the original circuit, a specific set of primitive placements in specific PLB's, and a specific set of interconnect usage decisions (routings). The software can then deem its mission to be complete and it can use the placement and routing results to generate the configuring code that will be used to correspondingly configure the designated CPLD.

In various instances, however, the CPLD configuring software may find that it cannot complete its mission successfully on a first try. It may find, for example that the initially-chosen placement strategy prevents the routing phase from completing successfully. This might occur because signal routing resources have been exhausted in one or more congested parts of the designated CPLD device. Some necessary interconnections may have not been completed through those congested parts. Alternatively, all necessary interconnections may have been completed, but the CPLD configuring software may find that simulation-predicted performance of the resulting circuit (the so-configured CPLD) is below an acceptable threshold. For example, signal propagation time may be too large in a speed-critical part of the CPLD-implemented circuit.

In either case, if the initial partitioning, placement and routing phases do not provide an acceptable solution, the CPLD configuring software will try to modify its initial place and route choices so as to remedy the problem. Typically, the software will make iterative modifications to its initial choices until at least a functional place-and-route strategy is found (one where all necessary connections are completed), and more preferably until a place-and-route strategy is found that brings performance of the CPLD-implemented circuit to a near-optimum point. The latter step is at times referred to as 'optimization'. Modifications attempted by the software may include re-partitionings of the original circuit design as well as repeated iterations of the place and route phases.

There are usually a very large number of possible choices in each of the partitioning, placement, and routing phases. CPLD configuring programs typically try to explore a multitude of promising avenues within a finite amount of time to see what effects each partitioning, placement, and routing move may have on the ultimate outcome. This in a way is analogous to how chess-playing machines explore ramifications of each move of each chess piece on the end-game. Even when relatively powerful, high-speed computers are used, it may take the CPLD configuring software a significant amount of time to find a workable solution.

In some instances, even after having spent a large amount of time trying to find a solution for a given CPLD-implementation problem, the CPLD configuring software may fail to come up with a workable solution and the time spent becomes lost turn-around time. It may be that, because of packing inefficiencies, the user has chosen too small a CPLD device for implementing too large of an original circuit.

Another possibility is that the internal architecture of the designated CPLD device does not mesh well with the organization and/or timing requirements of the original circuit design.

Organizations of original circuit designs can include portions that may be described as 'random logic' (because they have no generally repeating pattern). The organizations can additionally or alternatively include portions that may be described as 'bus oriented' (because they carry out nibble-wide, byte-wide, or word-wide, parallel operations). The organizations can yet further include portions that may be described as 'matrix oriented' (because they carry out matrix-like operations such as multiplying two, multidimensional vectors). These are just examples of taxonomical descriptions that may be applied to various design organizations. Another example is 'control logic' which is less random than fully 'random logic' but less regular than 'bus oriented' designs. There may be many more taxonomical descriptions. The point is that some CPLD structures may be better suited for implementing random logic while others may be better suited for implementing bus oriented designs or other kinds of designs.

Even where a CPLD architecture is specifically designed to mesh with bus oriented designs, the bit width of the bus oriented design may present a problem. More on this later. We first continue describing the usage of CPLD configuring software.

If the CPLD configuring software fails in a first run, the user may choose to try again with a differently-structured CPLD device. The user may alternatively choose to spread the problem out over a larger number of CPLD devices, or even to switch to another circuit implementing strategy such as FPGA or ASIC (where the latter is an Application Specific hardwired design of an IC). Each of these options invariably consumes extra time and can incur more costs than originally planned for.

CPLD device users usually do not want to suffer through such problems. Instead, they typically want to see a fast turnaround time of no more than, say a few hours, between the time they complete their original circuit design and the time a first-run CPLD is available to implement and physically test that design.

Aside from merely being able to implement a specific set of Boolean functions within a given CPLD IC, users of CPLD's also usually insist that the circuit implemented by the CPLD perform according to specified timing requirements. Speed is often as important an attribute as full Boolean correctness. That is why the user chose to use a CPLD instead of an FPGA.

Aside from speed and full function implementation, users of CPLD's also usually want a certain degree of re-design agility (flexibility). Even after an initial design is successfully implemented by a CPLD, users may wish to make slight tweaks or other changes to the original design. The re-design agility of a given CPLD architecture may include the ability to re-design certain internal circuits without changing I/O timings. Re-design agility may also include the ability to re-design certain internal circuits without changing the placement of various I/O terminals (e.g., pins). Such re-design agilities are sometimes referred to respectively as re-design Speed-Locking™ and Pin-Retention (the former term is a trademark of Vantis Corp., headquartered in Sunnyvale, Calif.). The more generic terms of: 're-design Speed-Consistency' and 're-design PinOut-Consistency' will be respectively used herein interchangeably with 're-design Speed-Locking™' and 're-design Pin-Retention'.

In addition to speed, re-design agility, and full Boolean correctness, users of CPLD's typically ask for optimal emulation of an original design or a re-design in terms of good function packing density, low cost, low power usage, and so forth.

When multiple CPLD's are required to implement a very large original design, high function packing density and efficient use of CPLD internal resources are desired so that implementation costs can be minimized in terms of both the number of CPLD's that will have to be purchased and the amount of printed circuit board space that will be consumed.

Even when only one CPLD is needed to implement a given design, a relatively high function packing density is still desirable because it usually means that a lower cost member of a family of differently sized CPLD's can be selected or that unused resources of the one CPLD can be reserved for future expansion needs or In-System Configuration re-design (ISC redesign).

In summary, end users want the CPLD configuring software to complete its task quickly and to provide an efficiently-packed, high-speed compilation of the functionalities provided by an original circuit design, or by a design tweak, irrespective of the taxonomic organization of the original design.

Some previous CPLD architectures meshed well with specific taxonomic organizations. However, preferences among taxonomic organizations tend to change over time. Industry standards may, at first, favor designs where address and data words have a size in the range of 8 to 16 bits. Later, industry standards may migrate towards larger-sized organizations of signals such as address and data words having sizes in the range of 32 to 64 bits. A CPLD having an architecture that is optimized for bus-oriented word sizes of 8 to 16 bits may not be able to efficiently accommodate designs where word sizes increase into a range of say, 32 to 64 bits. What is needed is a scalable architecture that can accommodate designs having word sizes in the range of 32 to 64 bits without losing speed and re-design agility.

SUMMARY OF THE INVENTION

An improved, scalable CPLD device in accordance with the invention comprises a two-tiered hierarchical switch matrix construct having a Global Switch Matrix (GSM) and a plurality of Segment Switch Matrices (SSM's). Coupled to each SSM is a plurality of programmable logic blocks (referred to as SLB's herein). Each SSM and its plural number of SLB's define a 'segment' that couples to the GSM.

Each SLB can receive B times 125% independent input signals from its respective SSM, where B is a dataword bit-width of a nominal design problem (e.g., a 64-bit wide design problem, in which case, 1.25×B=80). Each SLB can generate product term signals (PT's) that are Boolean products of as many as all of its 1.25 times B, independent input terms (e.g., 80 independent input signals). With use of simple allocation and/or 'super-allocation' (where the latter is defined below), substantially large sums of such input-dense PT's may be produced in each SLB. Some of the product terms generated within each SLB may be dedicated to SLB-local controls.

Each SLB has at least 32 macrocells and a plurality of I/O pads associated with the SLB. The macrocells and associated I/O pads of each SLB feed their respectively produced signals directly both to the local SSM and to the global GSM. Note that the direct feeding of result outputs from local-level macrocells to the global-level GSM, while bypassing the SSM, constitutes a breach of normal hierarchy rules. Under normal rules, the local-level macrocells would feed their outputs only to an intermediate-level construct such as the SSM, and the latter would then feed selected ones of such outputs to a next-higher of hierarchical structures, such as to the global-level GSM. However, in accordance with the invention, hierarchy is circumvented on the output side in order to speed result signals forward for global broadcast to subsequent resources of the CPLD.

Some or all of the plural I/O pads associated with each given SLB may be 'buried', meaning they do not connect to external packaging pins. Thus the number of external packaging pins per segment can vary and can go as high as all the I/O pads of each SLB multiplied by the number of SLB's per segment. In one embodiment, there are at least 16 I/O pads associated with each SLB and 4 SLB's per segment. Thus there can be as many as 64 I/O pins or more per segment in this embodiment.

Each SSM has within it and dedicated for intra-segment communications, at least as many longlines as there are macrocells and I/O pads in the segment. This assures that every macrocell signal (MFB) and every I/O signal (IFB) of the segment can be simultaneously broadcast through the SSM. Each broadcast signal (longline signal) of the SSM preferably has at least 3 ways of feeding into a targeted SLB of the same segment. Thus, an in-segment SLB that generates a feedback signal can assuredly transmit the feedback signal through its local SSM and then back to either itself or to another SLB of the same segment. CPLD configuring software is thereby given wide flexibility for routing intra-segment signals.

Each SSM further has within it, and as dedicated for inter-segment (global and/or broadcast) communications, at least as many longlines as there are macrocells and I/O pads in the segment, thereby assuring that every macrocell signal (MFB) and every I/O signal (IFB) can be simultaneously transmitted through the GSM from one segment to one or more other segments. The GSM has at least as many longlines for inter-segment (global) communications as do two SSM's. Thus 100% inter-segment (global) communications may occur simultaneously between each of two pairs of segments. Each SLB has at least 4 ways (and in one embodiment, at least 12 ways) of transmitting a feedback signal (MFB or IFB) through the GSM and then back to either its own segment or to one or more other segments.

For one embodiment where B is 64, the 80 (=B times 1.25) parallel inputs of each SLB ease implementation of 64-bit wide design problems. Each segment has at least 64 I/O pads. Some or all I/O pads of a given one or more SLB's in the segment may be buried ones. Symmetry within the design of each segment allow for more finely-granulated implementations such as for 32 or 16-bit wide designs. A convenient migration path is therefore provided by one unified architecture for implementing 16-bit wide designs, 32-bit wide designs, and 64-bit wide designs.

Other aspects of the invention will become apparent from the below detailed description.

BRIEF DESCRIPTION OF THE DRAWINGS

The below detailed description makes reference to the accompanying drawings, in which.

DETAILED DESCRIPTION

Figure 1:
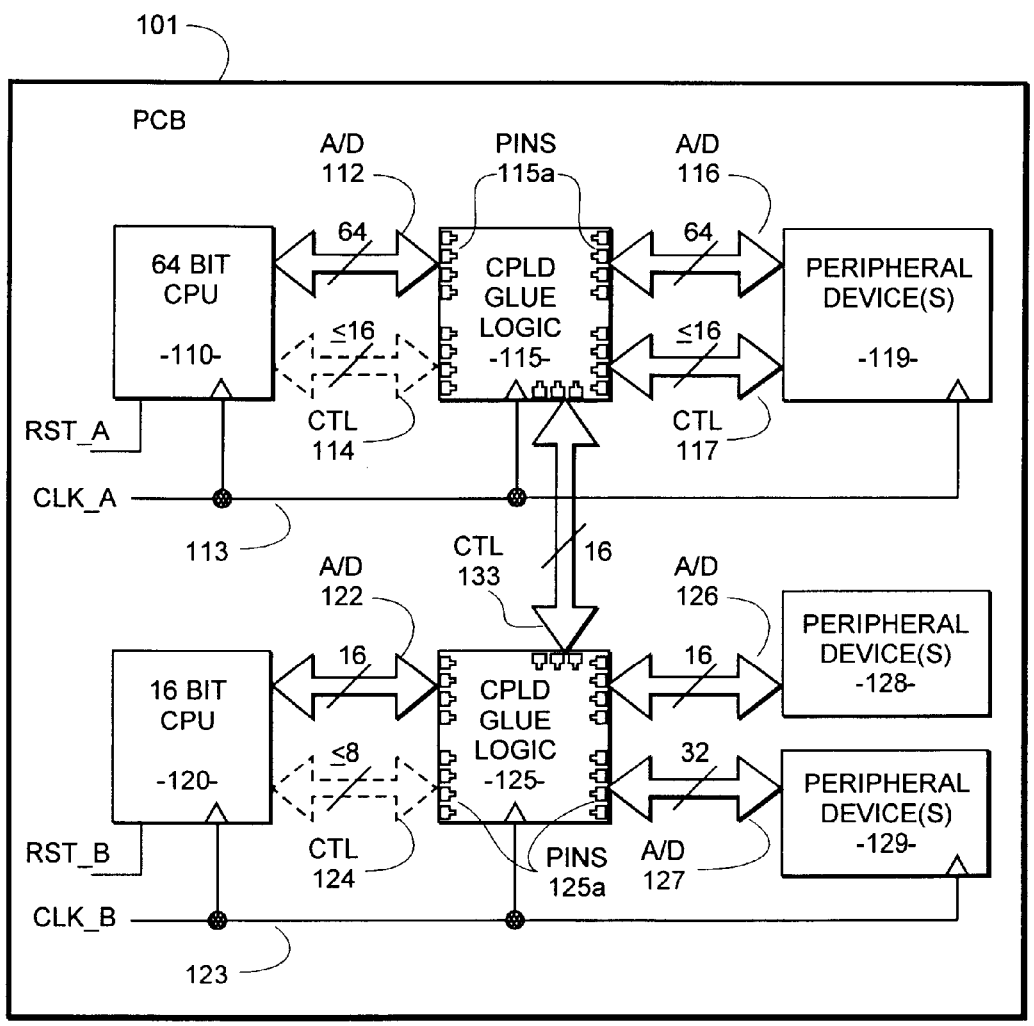
FIG. 1 is a block diagram of a design problem that may call for CPLD glue logic with capabilities to efficiently handle differing word sizes.

FIG. 1 shows, for purpose of example, a possible system 100 that uses plural CPLD's such as 115 and 125 for 'glue logic'. CPLD 115 is a first integrated circuit having a respective plurality of I/O pins 115a (external terminals) that are coupled by PCB traces to other circuits provided on a printed circuit board (PCB) 101 of the system 100. CPLD 115 is interposed between a first central processor unit (CPU) 110 and one or more, on-board or off-board peripheral devices 119 associated with that first CPU 110.

CPLD 125 is similarly a second integrated circuit having a respective plurality of I/O pins 125a that are coupled by PCB traces to other circuits provided on the same printed circuit board 101. CPLD 125 is mounted to PCB 101 so as to provide interfacing between a second CPU 120 and its respective, on-board or off-board peripheral devices 128, 129.

In the illustrative case of system 100, CPU 110 is a 64-bit microprocessor that has a 64-bit wide, and time-multiplexed, address/data bus 112 (A/D bus 112). CPU 110 further has a clock input line 113 for receiving a respective first clock signal, CLK_A.

Additional control signals (CTL) may be provided on a separate control bus 114. Bidirectional bus 114 is depicted by a dashed, double-arrow symbol to indicate that it may either be physically there in full or it may instead be partly or wholly a phantom bus whose CTL signals are instead included as time-multiplexed signals that are passed along the, 64-lines wide, A/D bus 112.

If CTL bus 114 is real rather than phantom, then a corresponding number of the I/O pins 115a of IC 115 will be consumed for servicing that real bus. If CTL bus 114 is instead phantom, then the same I/O pins 115a that service A/D bus 112 can also service the control signals of bus 114 on a time-multiplexed basis. Of course, for the latter case, additional signal-processing resources within the CPLD 115 may have to be consumed to support the time-multiplexed routing of the A/D and CTL signal transmissions through a shared set of I/O pins 115a. Also for the latter case, the speed at which CPLD 115 can process the A/D signals (112) may be disadvantageously reduced because time slices are being donated (stolen) to support the transmitting of the CTL signals (114).

Empirical observations have shown that the number of parallel lines that will generally be needed for carrying the CTL signals 114 associated with address and/or data signals of the 64 parallel lines in A/D bus 112, is typically about 8 or slightly more. In other words, the number of further-and-control carrying, parallel lines in the real or phantom CTL bus 114 tends to be on the order of about 12.5% or a slightly larger fraction of the number of parallel lines in associated A/D bus 112. It can be less as well. In some instances, the number of further-and-control carrying, parallel lines in the real or phantom CTL bus 114 can be as large as 25% of the number of parallel lines in the A/D bus 112.

Examples of signals that might be deemed as parallel and overhead CTL signals include: error correction bits, frame identifying bits, and handshake protocol bits. More specifically, if simple parity check is used, then there will usually be one parity bit for every 8 bits of a data word. Thus a 64-bit wide address and/or data word might call for at least 8 additional CTL overhead bits just for providing a simple error detection function. More bits may be used if more complex, error catching and correction (ECC) functions are to be provided.

If A/D bus 112 is used on a time-multiplexed basis, then one or more additional ones of the CTL overhead bits 114 may serve as frame identifying bits for identifying what phase and/or process is having its data being transmitted at the moment over bus 112. For example, a first time slice may be dedicated for a CPU address-outputting phase for a process involving a first of plural peripheral devices (119) while a second time slice may be dedicated for a peripheral data-inputting phase for a process involving a second peripheral device.

One or more additional ones of the CTL overhead bits 114 may serve as handshake protocol bits whereby peripheral devices (119) acknowledge error-free receipt of instructions or data and/or they report what state they are next going into (e.g., bus master or slave).

The CTL overhead bits (114) described above are merely examples. There is a wide range of possibilities for different kinds of industry standard buses (e.g., SCSI, PCI, etc.) and for nonstandard bus designs. Even when one considers a simple 8:1 parity check with one additional bit for flagging data versus address, and one further additional bit for handshaking, it is seen that 10 bits (about 16% of 64) have already been consumed on the CTL bus 114 for supporting a 64-bit wide A/D transmission on bus 112. If both an A/D bus transmission and a control overhead transmission are to occur in parallel so that the CPLD glue logic 115 can process both simultaneously rather than in separate time slots, then the CPLD glue logic 115 needs to have a sufficient number of external package pins and internal resources to handle such, relatively-wide, parallel transmissions.

Typically, the CTL overhead bits (114) will include a RESET signal for flagging a global resetting, to a predefined state, of the CPU 110 and its associated circuits 115 and 119. Thus, one yet further overhead control signal that may need to be carried by the actual or phantom CTL bus 114 is such a global RESET signal. In the illustrated example, the RESET signal for CPU 110, CPLD 115, and peripheral device(s) 119 is initiated by actuating a RST_A line that is coupled to the CPU 110. It then propagates through CTL buses (e.g., 114 and 117 where the latter is described shortly) to reach the other devices.

Typically, when the first A/D bus 112 that couples CPU 110 to CPLD 115 is 64-bits wide, there will be a corresponding 64-bit wide and second A/D bus 116 provided between the CPLD glue logic 115 and its one or more, associated peripheral devices 119. It is possible, on the other hand, that the address/data interface between the CPLD glue logic 115 and peripheral devices 119 may have a word size smaller than 64 bits, for example, such as 32 bits or 16 bits.

Also as shown, there will typically be a real or phantom, second control bus 117 between the CPLD glue logic 115 and peripheral devices 119. The number of parallel control signals carried by this phantom or real control bus 117 will usually be about the same as that carried by the first CTL bus 114, although it may be different.

The total number of the I/O pins 115a of IC 115 that are consumed for servicing A/D buses such as 112, 116 and CTL overhead buses such as 114, 117 will vary depending on how wide each and all of the utilized buses are, and what extent each is phantom or real. Of course, although it may have more pins, CPLD 115 must have at least as many I/O pins 115a as are necessary for simultaneous servicing of its respective and various buses 112, 116, etc.

In the illustrative system 100, the second CPU 120 is a 16-bit microprocessor that has a corresponding 16-bit wide, time-multiplexed, address/data bus 122 (A/D bus 122). Second CPU 120 further includes a respective clock input line 123 for receiving a respective second clock signal, CLK_B. Additional control signals (CTL) may be provided on a separate, third control bus 124. Bus 124 is shown dashed to indicate that it may either be physically there in full or may instead be partly or wholly a phantom bus whose corresponding CTL signals are included as time-multiplexed signals along A/D bus 122.

The number of further parallel lines that may be needed for carrying control signals 124 associated with address and/or data signals of the 16 parallel lines in A/D bus 122, is typically about 2 or sightly more (about 12.5% or a greater fraction of the number of parallel lines in associated A/D bus 122, e.g., 2 parity bits). In some rare instances however, the number of further-and-control carrying, parallel lines in the real or phantom CTL bus 114 can be as large as about 50% (about 8 lines). One of the control signals that is carried by actual or phantom CTL bus 124 can be a RESET_B signal for flagging a resetting to a predefined state of second CPU 120 and its associated circuits 125 and 128, 129. In the illustrated example, the RESET_B signal for second CPU 120, second CPLD 125, and corresponding peripheral devices 128, 129 is initiated by actuating a RST_B line that is coupled to the CPU 120.

Typically, when the third A/D bus 122 that couples second CPU 120 to second CPLD 125 is 16-bits wide, there will be a corresponding 16-bit wide and fourth A/D bus 126 provided between the CPLD glue logic 125 and its one or more, associated peripheral devices 128. Additionally or alternatively there may be a corresponding, but narrower or wider fifth A/D bus 127 (e.g., 32-bits wide) provided between the second CPLD glue logic 125 and its one or more, associated peripheral devices 129.

Also, although not shown, there will typically be real or phantom, control buses between the second CPLD glue logic 125 and its associated peripheral devices 128, 129. The number of parallel control signals carried by these phantom or real control buses (not shown) will usually be about 12.5% or less of the number carried by the associated A/D bus, although it may be much higher such as 25% to 50%.

In addition to providing interfaces between different CPU's such as 110 and 120 and their respective peripheral devices 119, 128, 129; the CPLD glue logic circuits 115 and 125 may need to talk to one another over a control bus such as 133. The number of parallel lines provided in CTL bus 133 may be as many as 16, 32 or 64.

Given these various possibilities (FIG. 1), one problem that confronts designers of CPLD integrated circuits is how to arrange both the I/O pins (e.g., 115a, 125a) and internal components of a CPLD IC so that the CPLD (e.g., 115, 125) can operate efficiently both under circumstances where it is processing relatively small datawords having 16 or less bits each and where it is processing relatively larger datawords having 32, 64 or more bits each.

Speed is typically of the essence when CPLD's are being used. It is generally not acceptable to serialize a 64-bit design into 4 or more time slices that each process one fourth or a smaller fraction of a 64-bit wide operation. Users want the CPLD to process the entire 32, 64, or more bits of their wide-datapaths in parallel (simultaneously) so that processing results can be obtained as quickly as possible.

Figure 2:
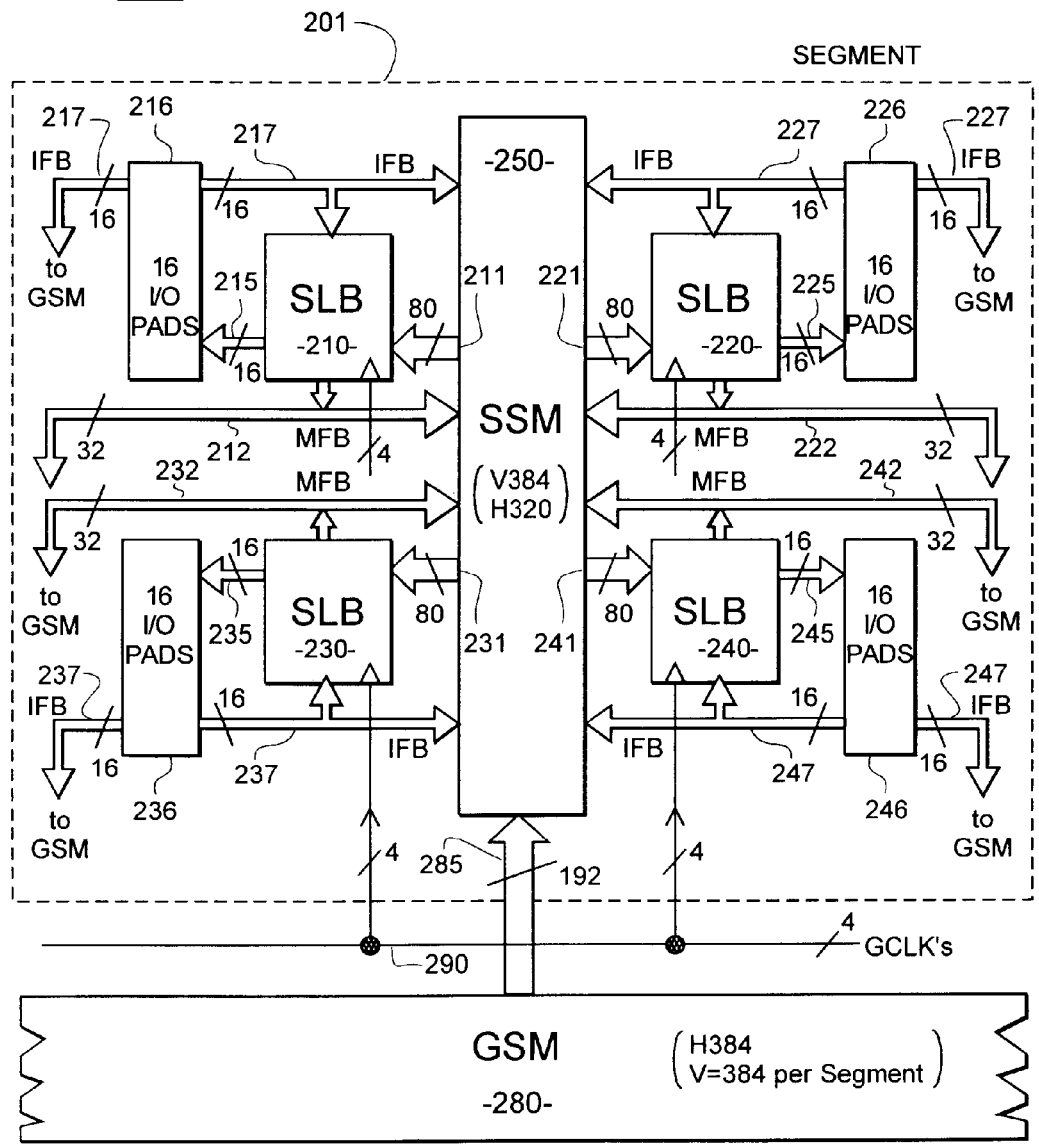
FIG. 2 is a block diagram showing one combination of a CPLD 'Segment' and a 'Global Switch Matrix' (GSM) in accordance with the invention.

FIG. 2 provides an introduction to a scalable CPLD architecture 200 in accordance with the invention that is designed to provide flexibility and speed.

The structure shown within dashed box 201 is referred to as a 'segment'. In a central portion of this segment structure 201, there is provided a Segment Switch Matrix (SSM) 250. Symmetrically disposed about the SSM 250 there are an even number of programmable logic blocks, such as the illustrated four identical units which are each referred to herein as a Super Logic Block (SLB). The four SLB's are respectively designated here as 210, 220, 230 and 240. Corresponding and identical groups of 16 I/O pads each (where the pads are either buried, or contrastingly, connected to external terminals) are provided respectively for SLB's 210, 220, 230 and 240. The I/O pad groups are respectively designated as 216, 226, 236 and 246.

It is seen from the broad overview of FIG. 2 that a 'segment' 201 is capable of inputting and/or outputting as many as 64 I/O signals simultaneously from the combination of I/O pad groups 216, 226, 236 and 246. The same arrangement 201 may alternatively be used for transceiving the signals of four separate, 16-bit wide buses or for transceiving the I/O signals of two, 32-bit wide buses. SSM 250 can be symmetrically organized to provide efficient operation for 64-bit wide bus operations, 32-bit wide bus operations, or 16-bit wide bus operations, or even 8/24-bit wide bus operations if desired.

Referring to SLB 210 as an exemplary representative of the identically-structured other three SLB's of the same segment 201, each SLB receives a first set of 80 input signals from the SSM 250. The first SLB input set for SLB 210 is identified as 211. Independent, but essentially similar SLB input sets of 80 signals each are available to each of the other SLB's 220–240 of the same segment 201 and are each carried by a respective, 80-bits wide bus. The SLB input buses of the other three blocks are respectively designated as 221, 231 and 241.

The 80-bits carried by the eighty parallel lines of first input bus 211 can represent, by way of example, sixty-four simultaneous bits of data or address combined with up to sixteen simultaneous control signals (up to a 25% control overhead). Thus if B is the number of parallel databits of a given design problem, each SLB can support parallel processing of 125% of B up to a value where, for the illustrated segment design, B can be as large as 64 bits. Migrations to larger segment designs where B is 96, 128, and so forth are within the spirit of the present invention. Of course, die size may have to be increased and pin-to-pin delay may suffer if the number (B times 1.25) of SLB input lines per SLB increases without commensurate improvements in the underlying technology (e.g., without using smaller, lower voltage transistors, without using metal interconnect with lower resistivity such as copper, and so forth).

Each of the eighty lines of input bus 211 is a general purpose line that may be used for carrying any kind of input signal. The example that is given above regarding 64 address/data signals and 16 overhead control signals is merely an example to demonstrate how the architecture of segment structure 201 may be exploited to implement a circuit that corresponds to CPLD 115 (FIG. 1), and its 64-bit wide A/D bus 116 and its associated 16-bit wide, overhead control bus 117. All 80 SLB input signals can be present at a same time as independent signals that are output from SSM 250 and are input through SLB input bus 211 into SLB 210 so that the 80 SLB input signals (211) can be simultaneously processed by SLB 210.

Because a control overhead of 25% is an extreme and the more typical control overhead is about 12.5%, the excess part of the 80 input paths provided by SLB input bus 211 can be seen as a kind of agility insurance that gives CPLD configuring software more degrees of freedom for routing a necessary signal from SSM 250 into SLB 210.

SLB 210 can produce 32 macrocell result signals where each is a sum-of-products function whose product terms (PT's) can each be a product of up to the full 80, general purpose signals provided by input bus 211 or their complements. If desired, the 80 general purpose signals provided by input bus 211 may be used to form: one or more of local control signals for specific macrocells (e.g., I/O_OE) and/or local control signals for specific blocks (e.g., SLB_RST) and/or local control signals for specific segment-wide control functions (e.g., SEG_RST) and/or global control signals for CPLD-wide, global control functions (e.g., GLB_RST).

The sum-of-products (SoP) result signals 212 that are produced by the 32 macrocells of each SLB (210) are also referred to herein as macrocell feedback signals or 'MFBs'.

In one embodiment (see FIG. 5), each MFB signal can take on the expressive form:

$$f_{SoP} = \Sigma^{N=5+}(PTi^{Ki}/80 \max/(L1=192\_Local([8]+L2=192\_Global([8]))\{Exp.\ B\}$$

wherein the N=5+ factor indicates that a single-delay, one-pass sum can be a sum of a 'cluster' of at least as many as five product terms (5 PT's), but can be larger with use of allocation. In the expression, Exp. B, each product term, PTi can be a Boolean AND of as many as 80 independent input signals.

The Kmax=80 independent input signals of Exp. B can be obtained by sampling from a larger available set of 384 signals. The available set of L=384 lines is subdivided into 192 segment-wide, local lines (L1 or 'Level 1') and 192 global lines (L2 or 'Level 2'). The '[8]' factor that divides into each of the Level 1 (L1) lines and Level 2 (L2) lines indicates the level of partial-population that fills the crosspoints array formed by the intersection of the Kmax=80 lines (bus 211) of each SLB and the crossing L1=192 and L2=192 lines of SSM 250.

In Exp. B, the value of L1 was chosen so that L1 equals at least the number of MFB's in the segment (32 times 4) so that 100% of these can be fed back by the Level 1 interconnect and additionally at least the number of IFB's in the segment (16 times 4) so that 100% of these can be fed from respective I/O pads to the Level 1 interconnect. Further in Exp. B, the value of Kmax=80 was chosen to be at least 125% of the targeted width of 64-bit wide data buses so that up to 25% additional control overhead can be supported in parallel. Further in Exp. B, the local multiplexing factor of [8] was chosen so that each signal of the Level 1 interconnect has at least 3 ways of being routed from the SSM to a desired SLB. More specifically, Kmax=80 times 8 PIP's per SLB input line, divided by L1=192 SSM local lines provides a routability of 3.33 ways for the Level 1 interconnect signals.

Moreover in Exp. B, the value of L2 was chosen so that L2 equals at least the number of MFB's plus IFB's in each segment (48 times 4) so that 100% of these can be fed from one segment to a second segment by way of the GSM and the Level 2 interconnect to the SLB's of the second segment. L2 does not have to be the same as L1. It can be larger. However, one of the concerns is the additional time delay involved in routing signals through the GSM from one segment to another. If L2 is increased the GSM delay tends to disadvantageously also increase. Further in Exp. B, the value of the global multiplexing factor of [8] was chosen so that each signal of the Level 2 interconnect has at least 3 ways of being routed from the SSM to a desired SLB. More specifically, Kmax=80 times 8 PIP's per SLB input line, divided by L2=192 SSM global lines provides a routability of 3.33 ways for the Level 2 interconnect signals. The routability for Level 2 signals does not have to match that of Level 1 signals. In the particular embodiment of Exp. B, it does.

Qualifier words used above, such as 'single-delay' will be detailed later. Those skilled in the art of CPLD's can appreciate that the N=5+ value can be raised to larger values such as N=10 or N=20 or larger by use of sums re-allocation. In a sums re-allocation operation (see also FIG. 6), a sum of sums (SoS) is formed. For example, four SoP's of 5 PT's each might be ORred together to define a SoP of 20 PT's. The result of a first Sum-of-Sums (SoS) operation may itself be further allocated as a contributing sum to a yet larger SoS (this is referred to as 'super'-allocation herein). For example if the 20 PT's result of a first OR gate are summed during re-allocation with the 20 PT's result of a second OR gate, a functionally richer result based on 40 PT's is obtained. However such chained re-allocation (super allocation) may incur additional gate delays. Each serial passage of a bottle-necking PT signal through more OR gates increases the ultimate delay of the resulting Sum-of-Sums. Thus the value, N=5+ can be much larger if the circuit designer is willing to tolerate more than a single quantum of allocation delay.

Continuing with our overview of FIG. 2, MFB signals 212 are fed both to SSM 250 and to Global Switch Matrix (GSM) 280. Note that the direct feeding of outputs from local-level SLB's to the global-level GSM, while bypassing the SSM, constitutes a breach of normal hierarchy rules. Under normal rules, the local-level SLB's would feed their outputs only to an intermediate-level construct such as the SSM, and the latter would then feed selected ones of such outputs to a next-higher of hierarchical structures, such as to the global-level GSM. However, here, MFB outputs (212) and/or IFB outputs (217) are being fed directly into the GSM 280.

If the delay of feedback or cascading can be tolerated in a given design, then any one or more of the 80 inputs of SLB input bus 211 can itself be an MFB signal that was originally generated by the same SLB 210 and thereafter fed back through either SSM 250 alone or through GSM 280 and then through the SSM 250 back to SLB 210. Alternatively or supplementally, any one or more of the 80 inputs of SLB input bus 211 can be an MFB signal that was generated by another SLB (220–240) of the same segment (201) and thereafter forwarded by way of SSM 250 and bus 211 to SLB 210. As yet another variation, any one or more of the 80 inputs of SLB input bus 211 can be an MFB signal that was generated by another SLB in a different segment (see FIG. 3) and thereafter passed through the GSM 280, and then through SSM 250 and then through SLB input bus 211 to reach SLB 210.

As yet a further variation, any one or more of the 80 inputs of SLB input bus 211 can be an externally-produced I/O signal (an IFB signal 217). Up to 64 such externally-produced I/O signals can come directly from the up-to 64 I/O pins (nonburied pads) of the illustrated segment 201 while up to another 16 such externally-produced I/O signals can come from I/O pins of other segments. This feature will be discussed further when we reach FIG. 8.

SSM 250 has 384 vertical longlines (indicated in the drawing by 'V384'). These V384 lines of SSM 250 can simultaneously carry 4 separate sets of 80 independent signals each respectively to the 4 SLB input buses 211, 221, 231 and 241 of SLB's 210, 220, 230 and 240. Note that the number of horizontal crosslines in SSM 250 is 320 (denoted as H320).

One possibility is that roughly one half (e.g., up to 48) or less of each set of a respective 80 signals is constituted by local, segment-generated signals and a remaining roughly one half part (e.g., up to 48) or less of each set of 80 signals is constituted by global signals that were generated outside the segment 201 and transmitted into SSM 250 by way of GSM 280. Note that 4 times 48 is 192, where the number 48 corresponds to the sum of 32 MFB outputs of each SLB plus the 16 IFB outputs (described shortly) associated with each SLB. In the illustrated example, GSM 280 can inject a same number of 192 global signals into a global part of SSM 250 as indicated by bus 285.

The number of global signals that GSM 280 can inject into each SSM does not have to be the same as the number of local signals carried by the SSM 250. It just turned out to be the same for this particular embodiment. For an alternate embodiment, it is contemplated that the GSM will be able to inject up to 256 global signals into each SSM. The number of longlines in the GSM may have to be increased commensurately however. That means that die size may become larger, more PIP's may need to be provided in each switch matrix, and more delay may be incurred.

Another possibility for our example wherein four sets of 80 signals each are being carried by the 384 longlines of SSM 250 is that, two of these sets (a total of 160 signals) are fully constituted by local, segment-generated signals, while the other two of these sets of 80 signals each are fully constituted by global signals that were generated outside the segment 201 and transmitted into SSM 250 by way of GSM 280.

The extra number of lines provided by the difference in SSM parameters, V384–H320=V64 provides a form of insurance or padding for the CPLD routing software. As will be seen in FIG. 5, SSM 250 can contain a large number of crosspoints. (Kmax=80 times L=384 equals 30,720 crosspoints per SLB.) However, not all of these will be populated by PIP's. The partial-populating of crosspoints means that not all conceivable routing paths are available, as would alternatively have been the case if the crosspoints had been fully-populated by PIP's.

It was found by trial and error testing that the job completion speed of CPLD configuring software increases dramatically when the routability factor from each of the SSM longlines (the V384 lines) to a target SLB is increased from about 2 or less ways per longline to 3 or more ways (e.g., 3.33 ways on average, which value is calculated from Kmax=80 times 16 PIP's per H-line, divided by 384 V-lines). Increasing the routability factor to better than 4 increases the job completion speed of CPLD configuring software even more, but at the cost of increasing die size significantly and reducing pin-to-pin processing speed. Thus, a routability factor of about 3 and a fraction ways turned out to provide an acceptable balance between speeding CPLD configuration software and producing CPLD chips that are neither too large nor too slow.

The 32 MFB signals (e.g., 212, 222, etc.) that are respectively produced by the 32 internal macrocells of each SLB (210, 220, etc.) may be used to selectively generate a smaller subset of sixteen I/O signals. These 16, SLB-produced I/O signals may be provided on a tri-stated basis and by way of I/O bus 215 (225, etc.) to respective I/O pads 216 (226, etc.). Not all of the I/O pads 216 necessarily connect to an external package pin. Some may be 'buried' pads.

One or more of the sixteen I/O signals on I/O pads 216 may be instead generated outside the CPLD and supplied into the chip by way of respective I/O pins that connect to nonburied ones of the I/O pads 216. The externally-sourced or internally-produced I/O signals may be transmitted by way of bus 217 from I/O pads 216 to SSM 250 and also to GSM 280. Bus 217 may also serve as a path by way of which externally-generated signals enter the CPLD through I/O pads 216 and then enter into the SLB 210 for synchronization before being forwarded via bus 212 or 215 to one or both of SSM 250 and GSM 280. In this latter transfer process, an internal (not shown), data storing portion of SLB 210 may receive the externally-sourced I/O signals 217 for storage and subsequent output onto MFB bus 212 and/or I/O bus 215 as will be described below.

Although the above discussion has focused on SLB 210, it is to be understood that each of SLB 220, 230 and 240 has a similar arrangement of inputs and outputs which are referenced accordingly in FIG. 2. Furthermore, each of SLB 210, 220, 230 and 240 receives four global clock signals (GCLK's) from a global clock bus 290 that extends fully across the CPLD array.

It is seen from the above that SSM 250 receives 192 general purpose, global signals from GSM 280 by way of connection 285. Another 192 input signals of Segment Switch Matrix 250 are defined by the 100% intra-segment return of the four sets of 48 signals each produced by the MFB and IFB resources (buses 212, 217, 222, 227, 232, 237, 242, 247) of the corresponding SLB's 210–240. SSM 250 can be viewed as including a matrix of 384 vertical longlines (V-LL's) and 320 crossing over, horizontal shortlines (H-SL's). The count of the 320 shortlines is formed by the four sets of 80 signals each output from the SSM 250 into respective SLB input buses 211, 221, 231 and 241. The crossed-lines matrix in SSM 250 of 384 vertical lines and 320 horizontal lines is represented by the symbol, V384/H320. This V384/H320 matrix of crosspoints is preferably, partially populated by a similar set of PIP's (programmable interconnect points) so that each SSM local longline is loaded by an essentially same and respective number of PIP's, and so that each SSM global longline is similarly loaded by an essentially same and respective number of PIP's, and furthermore so that each SSM shortline is loaded by an essentially same and respective number of PIP's. Thus, for the illustrated embodiment, a respective and substantially same delay is provided by routing to any corresponding SSM output line (of buses 211, 221, 231, 241) either a respective signal from any SSM local input (e.g., 212, 217) or a respective signal from any SSM global input (285).

GSM 280 can directly receive up to 192 general purpose signals from each segment (e.g., 201), can output up to 192 general purpose signals to each segment (by way of bus 285), and can carry as many as 384 inter-segment signals. The H384/(V384 per segment) matrix of crosspoints in GSM 280 is preferably, partially populated by a symmetrically distributed set of PIP's (programmable interconnect points) so that each GSM longline (horizontal) is loaded by an essentially same and respective number of PIP's and each to-GSM inputting shortline (vertical) is similarly loaded by an essentially same and respective number of PIP's and furthermore each from-GSM outputting shortline (feeds into 285) is similarly loaded by an essentially same and respective number of PIP's. Thus a substantially same delay is provided by routing a signal from any GSM input to any corresponding GSM output.

Figure 3A:
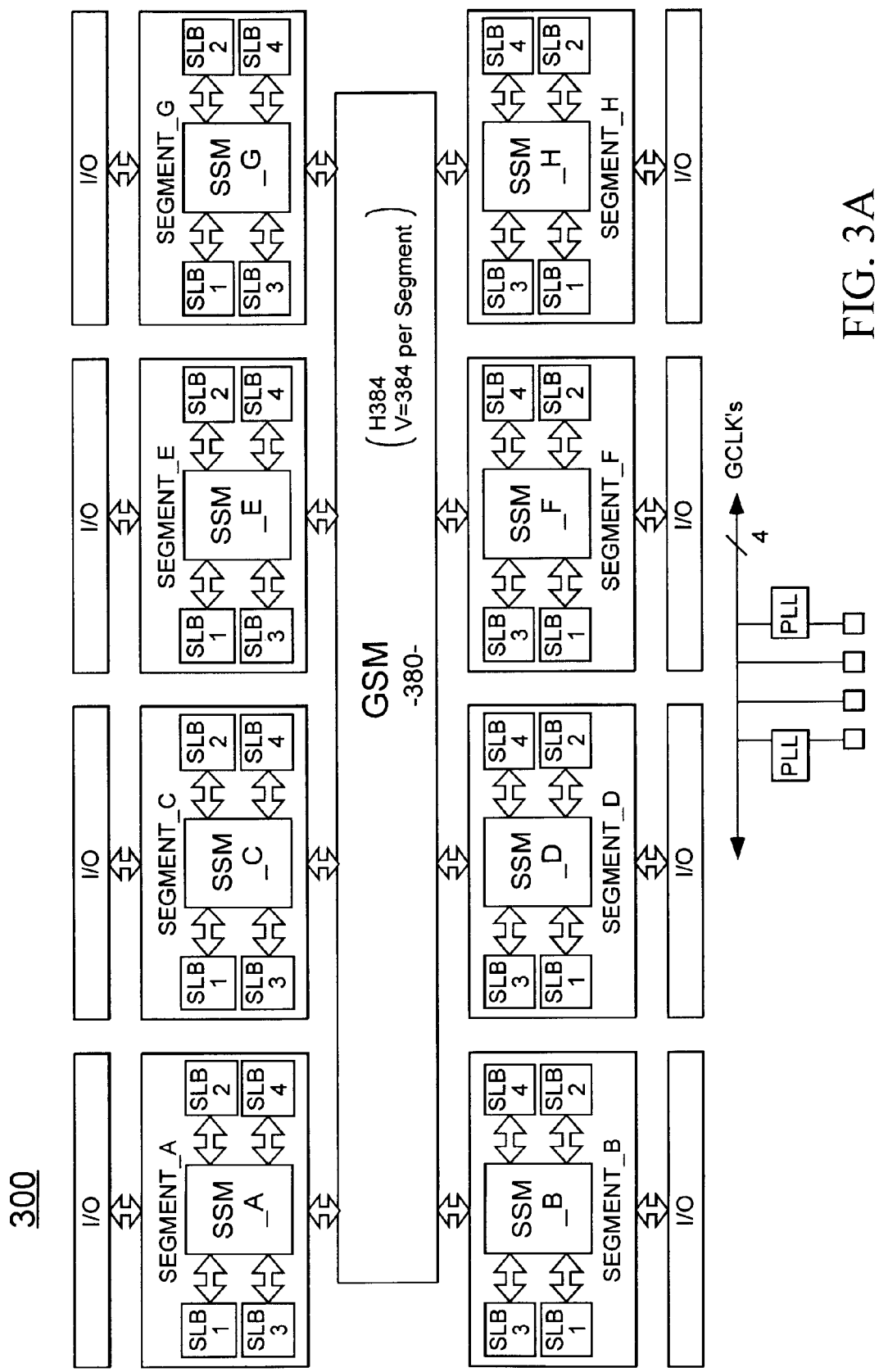
FIG. 3A is a block diagram showing a first CPLD having a plurality of Segments and a common GSM in accordance with the invention.

FIG. 3A illustrates a first CPLD monolithic device 300 in accordance with the invention. One version of monolithic IC 300 employs at least four layers of metal interconnect and transistors with drawn channel lengths of $0.35\mu$ or less and effective transistor channel lengths of $0.25\mu$ or less. The Vdd voltages of such $0.25\mu$ Leff transistors is typically 3.6V or less. The metal interconnect is used for longlines in switch matrices for reducing routing delays. The submicron transistors are used for defining PIP's (programmable interconnect points) having relatively short signal transmission times. Pin-to-any-other-pin delay time in CPLD 300 can be fixed (SpeedLocked™) to a global base delay as short as, in one embodiment, about 15 nS–12 nS (nanoseconds) or less, and in a second embodiment as short as about 10 nS or less for none-allocated or simply-allocated function signals (e.g., up to 20PT's per such signal). Intra-segment pin-to-any-other-pin delay time can be fixed (SpeedLocked™) in the second embodiment to a local base delay as short as about 7.5 nS or less for none-allocated or simply-allocated function signals. Pin-to-pin delay time for function signals that are generated with super-allocation (described below) may exceed the base delay values. The global SpeedLocking™ feature will be discussed further when we reach FIG. 8. The difference between simple-allocation and 'super'-allocation will be discussed further when we reach FIG. 6.

In one embodiment, where the die size is about 12,000 microns by 12,000 microns or less, the GSM longlines are each about 8,000 microns in length or less and are composed of standard aluminum alloys. Computer simulations have shown that, even though the standard design rules for such metal lines allow for a minimum width of $0.5\mu$ (half a micron) and a minimum inter-line spacing of $0.4\mu$, that RC effects on delay can be reduced when the width of the GSM metal lines is increased to about $1.6\mu$ or more but less than about $2.6\mu$; and where the inter-line spacing is increased to about $0.5\mu$ or more. If metal lines are made too narrow, resistance value R dominates the RC time delay. If metal lines are made too wide, capacitance value C dominates the RC time delay. If inter-line spacing is made too small, excessive cross-talk can occur. If inter-line spacing is made too large, die size tends to increase, line lengths tend to increase, and pin-to-pin speed suffers. Careful attention to layout, the resulting line lengths, and the utilized line widths can help to significantly reduce pin-to-pin time delays in the overall CPLD. Of course, exact numbers will vary depending on the details of the semiconductor, metal and dielectric technologies employed.

CPLD 300 comprises eight segments, respectively denoted as A–H, which are provided symmetrically about GSM 380. Each of segments A–H has 64 I/O pads and four SLB's. Some of the I/O pads may be buried ones (e.g., 32 per segment) while the others are connected to external pins. Each SLB contains 32, result-storing macrocells. The illustrated CPLD 300 therefore has 512 I/O pads and 1024 macrocells. There are 128 fully-interconnectable macrocells within each segment. If the pad burial rate is 50%, there will also be 256 I/O pins for the IC device.

There are four global clock (GCLK) pins in CPLD 300 Two of the pins are coupled to programmably-bypassable phase locked loops (PLL's) which then couple to two chip-wide GCLK lines. The other two pins connect directly to two other chip-wide GCLK lines. The PLL's may be used for frequency multiplication and/or division and/or phase adjustment relative to chip-external clock signals.

Each of segments A–H may operate as an independent and self-contained mini-CPLD that has up to 64 I/O terminals and has 128 macrocells. The 384 longlines (horizontal lines) of GSM 380 may be used as substitute for a printed circuit board which can interconnect the total of 512 I/O pads (buried or not) of the 8 mini-CPLD's in a wide variety of ways.

Alternatively, the 192 global V-lines (vertical lines) of a first Segment Switch Matrix (e.g., SSM_A) can be fully interconnected by way of the 384 H-lines of the Global Switch Matrix (GSM) 380 to receive a corresponding 192 global signals from any other segment (e.g., SEG_H) so that two segments can define a globalwise, fully interconnected, double-mini-CPLD. (The local 192 V-lines in each SSM can be used for fully-supporting local feedback.)

Alternatively, the 384 H-lines of GSM 380 may be used on a more sparing basis to couple certain selected MFB and/or IFB signals of any first Super Logic Block (e.g., SLB1_A) to serve as inputs for any other Super Logic Block (e.g., SLB4_H). CPLD configuring software determines how many such global interconnects can be made based on the interconnect flexibilities provided by the GSM 380 and SSM's A–H.

Figure 3B:
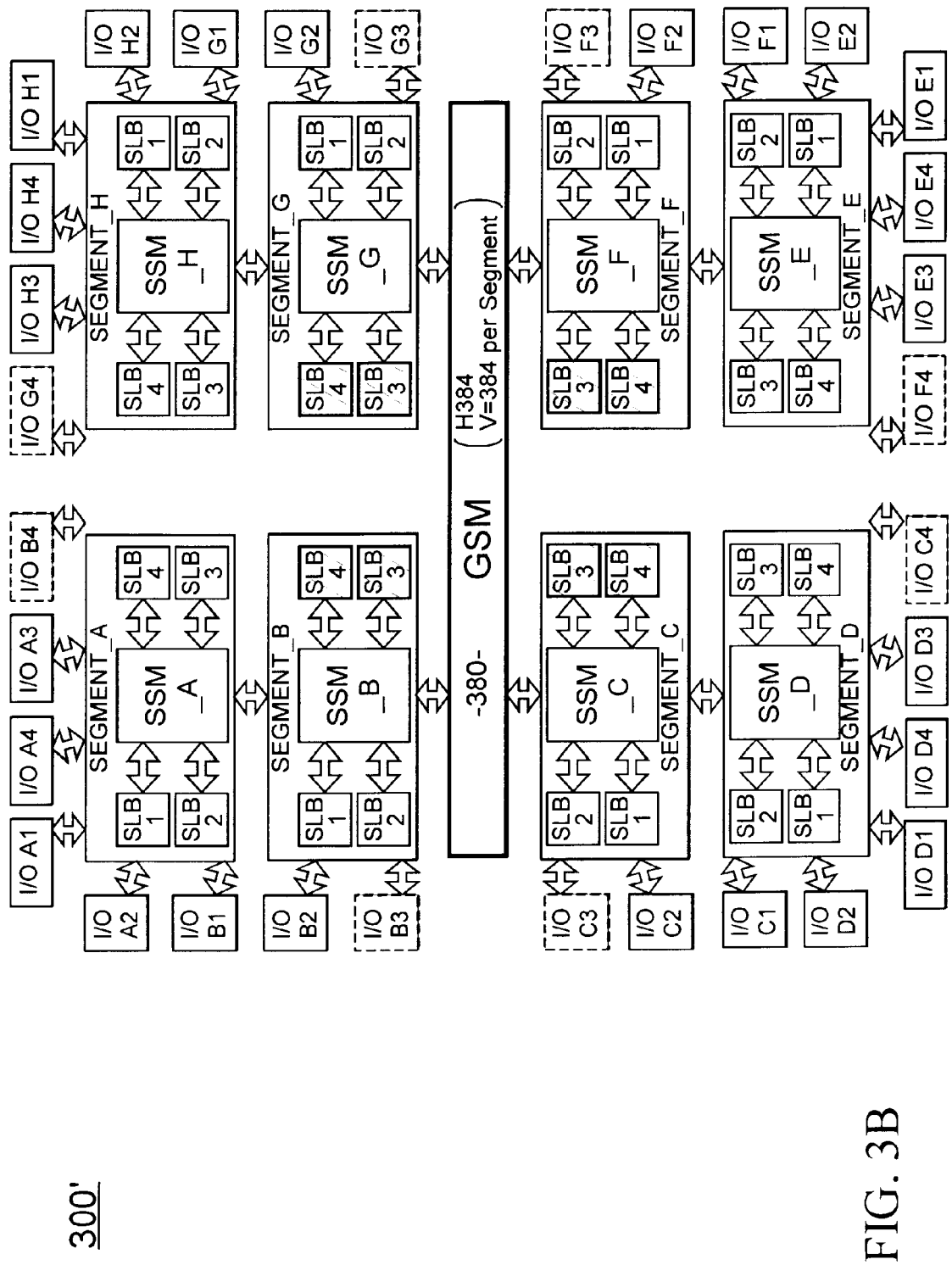
FIG. 3B is a block diagram showing a second CPLD having a plurality of Segments and a common GSM in accordance with the invention.

FIG. 3B illustrates a second CPLD monolithic device 300' in accordance with the invention having similar metal line and transistor technology as that of the first embodiment shown in FIG. 3A. Due to space limitations in the drawing, the global clock lines are not shown but are understood to be present. An underlying layout for metal lines of the GSM, and of MFB/IFB lines that feed into the GSM, will be seen when we discuss FIG. 7C. In FIG. 3B, segments A, B, G, and H are disposed to define a first square-like collection of segments above GSM 380' while segments C, D, E, and F are disposed to define a second square-like collection of segments below GSM 380'. The combination of segment layouts and the centralized GSM gives the die a general shape of a regular polygon (e.g., a square). This helps to minimize interconnect lengths and thereby improve signal propagation speeds.

I/O pins are clustered near respective SLB's in FIG. 3B so as to minimize the general length of pin-to-SLB wires. There are some trade offs. For example, SLB A3 is deeper into the core of the chip than is SLB A4. (Note that SLB numbering runs counter clockwise in the NW quadrant of the chip and is mirror-image symmetrical in the other three quadrants.) Pins cluster, I/O_A3 is placed closer to the column formed by SLB's A4 and A3 than pins cluster, I/O_A4 so that, the wire length between I/O_A3 and SLB_A3 is shortened at the expense of a slightly longer distance between I/O_A4 and SLB_A4.

In one embodiment, the near-core SLB's, 3 and 4 of segments B, C, F and G have all their pads buried so that relatively long, pin-to-pad wires are not used for reaching from the chip periphery into the near-core SLB's. In this embodiment, the following pins clusters are not present and are therefore shown as dashed (optional) in FIG. 3B: I/O_B3, I/O_B4, I/O_C3, I/O_C4, I/O_F3, I/O_F4, I/O_G3, and I/O_G4. The corresponding, near-core SLB's with fully-buried pads are identified with dashed cross hatching. If there are 16 I/O pins for each nonburied SLB and zero pins for each fully buried SLB, then this embodiment will sport 384 I/O pins (8×16 for core segments B, C, G, F; plus 16×16 for peripheral segments A, D, E, H). If, instead there are 16 I/O pins for every SLB (no buried pads), such an alternate embodiment will sport 512 I/O pins. Flip-chip BGA (Ball Grid Array) packaging may be more appropriate for such an alternate embodiment than a quad-side, peripheral pinout.

Figure 4A:
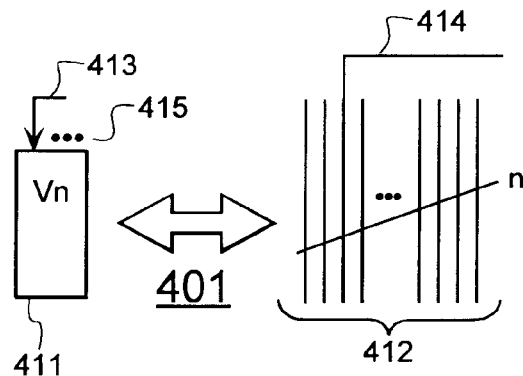
FIGS. 4A–4C provide a legend for various symbols used in others of the drawings.
Figure 4A:
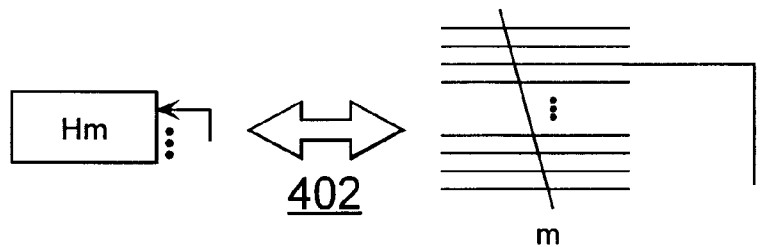
Figure 4A:
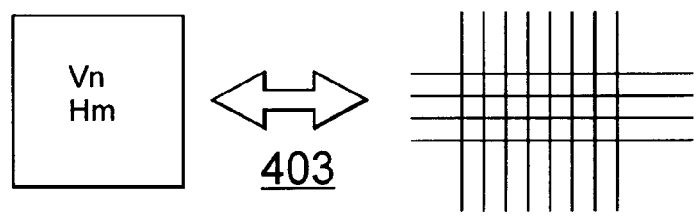
Figure 4A:
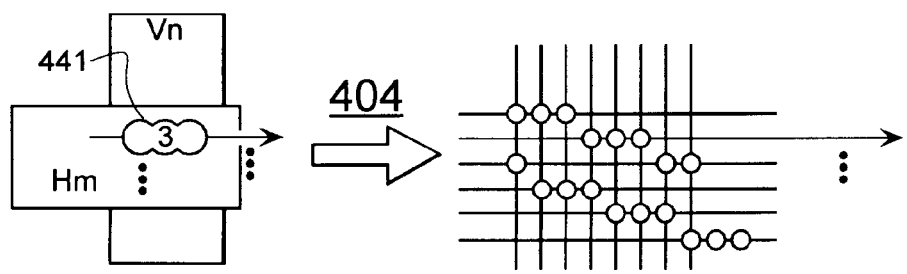
Figure 4B:
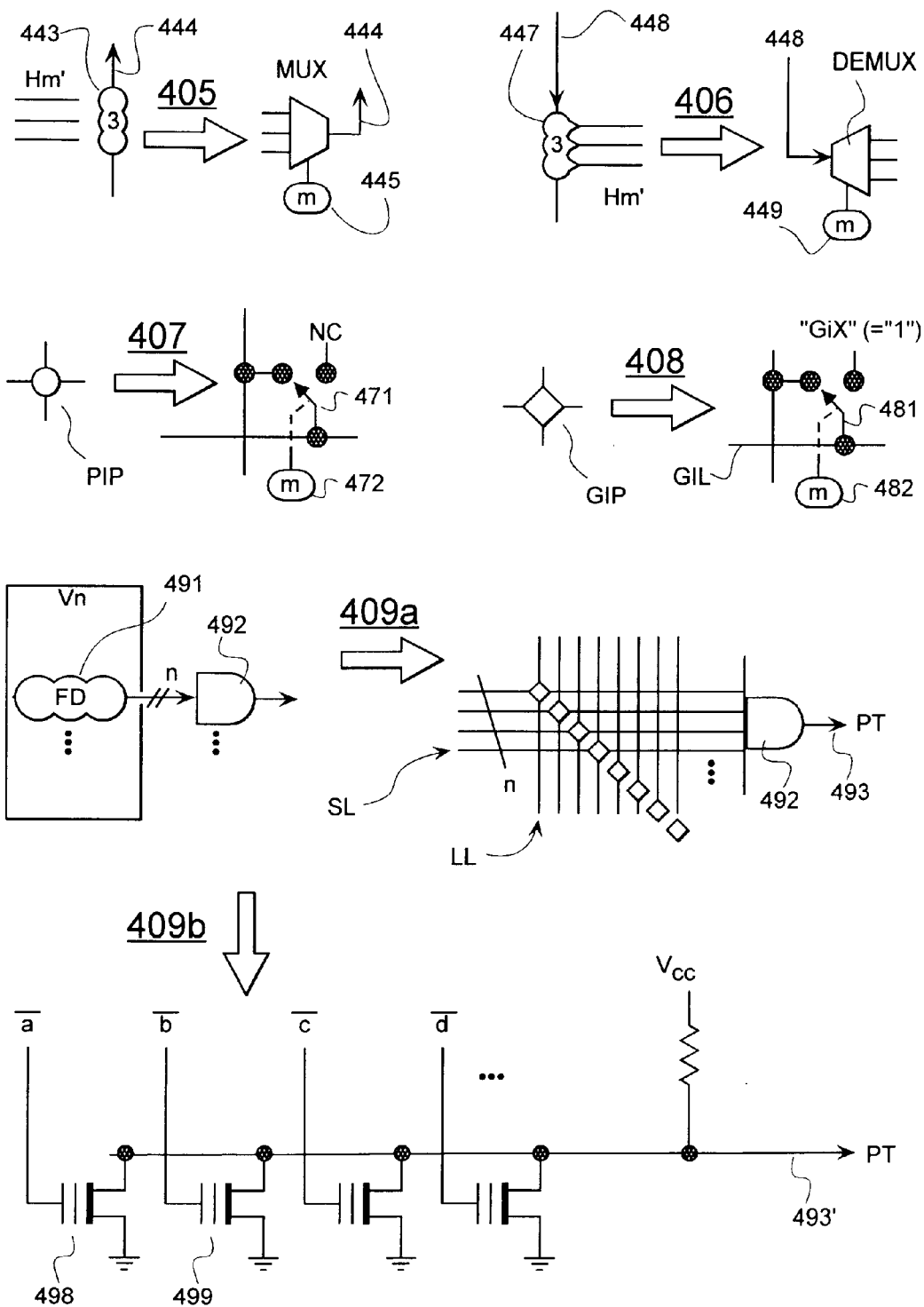
Figure 4C:
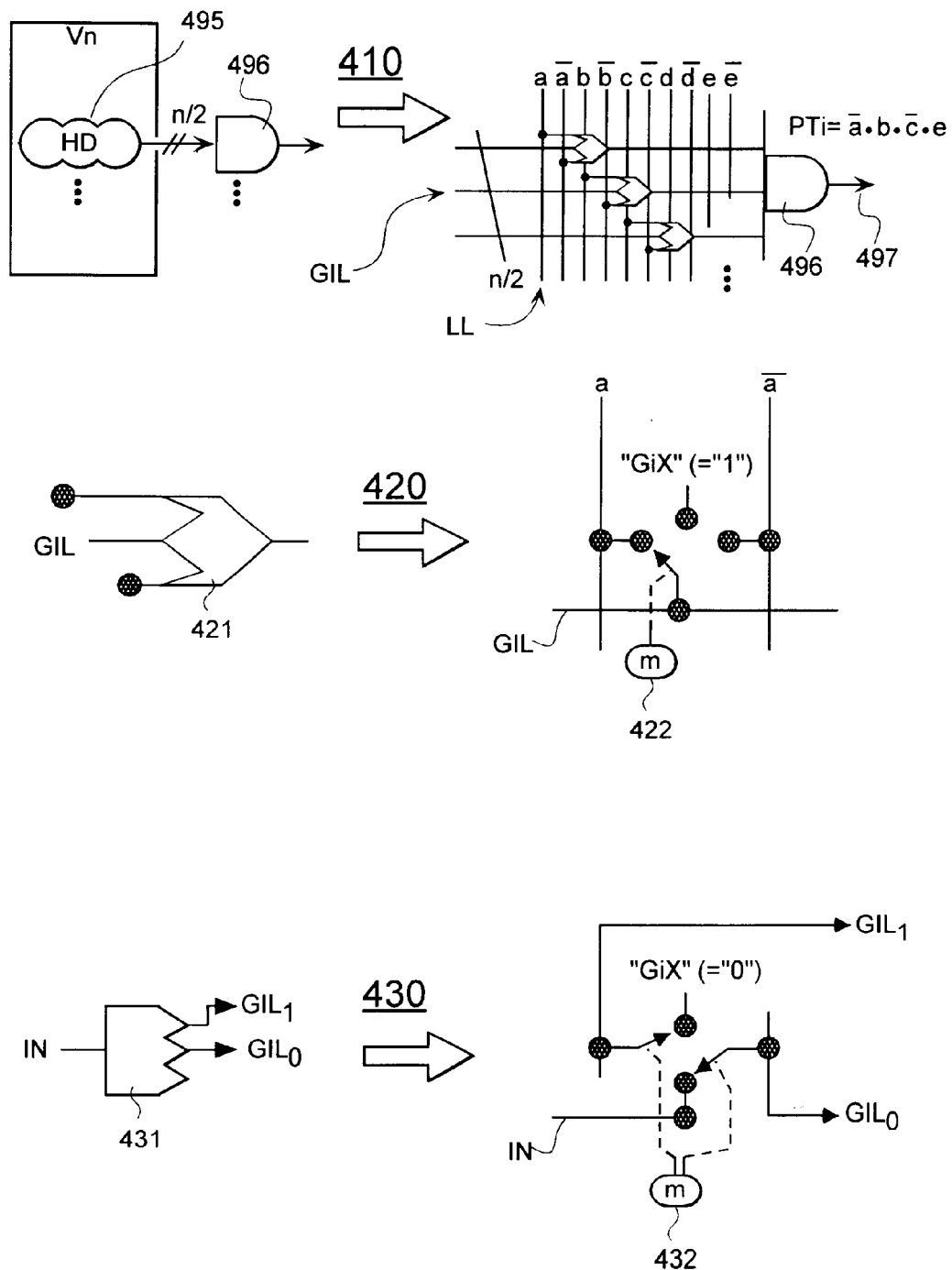
Figure 5:
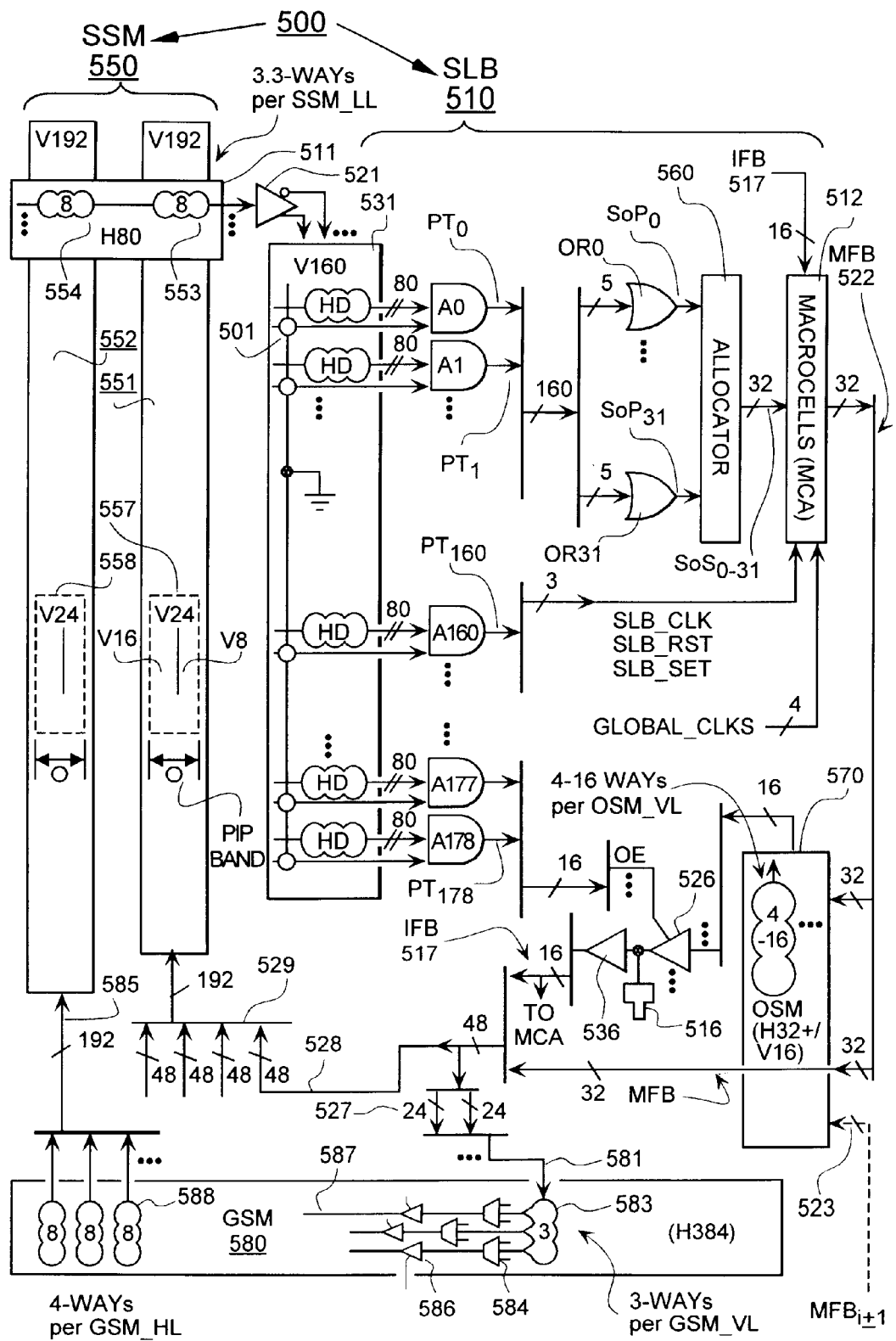
FIG. 5 is a schematic showing a 'Super Logic Block' (SLB) in accordance with the invention and further showing N-way routing capabilities provided by couplings through the corresponding 'Segment Switch Matrix' (SSM) and through the GSM.

FIG. 5 demonstrates how N-way routing flexibility may be provided in the feedback loops of one embodiment 500 due to the provided combinations of switch matrix sizes and multiplexer sizes. However, before FIG. 5 is discussed, the meanings of various symbols therein are explained by referring to the legend 400 of FIGS. 4A–C.

Interchangeability symbol 401 demonstrates that a rectangle 411 with insignia of the form 'Vn' in it represents a set 412 of n parallel lines extending in the vertical (V) direction. The vertical (V) direction is that used in the respective drawing and does not in any way limit the direction or directions of extension of a given, actual bus even though that bus is described herein as being 'vertical'.

A particular one line such as 413 may serve as an exemplary representative of the n V-lines of a bus such as 411. The counterpart of the exemplary representative line 413 is shown as 414 in the schematic at the right of interchangeability symbol 401. An arrow may be used to indicate signal direction within the exemplary line 413. The ellipses 415 indicate that the example is understood to be repeated.

Interchangeability symbol 402 demonstrates that a rectangle with insignia of the form 'Hm' in it represents a set of m parallel lines extending in the horizontal (H) direction. The horizontal (H) direction is that used in the respective drawing and does not in any way limit the direction or directions of extension of a given bus that is described herein as being 'horizontal'. Of course, when a horizontal first bus crosses with a vertical second bus, a corresponding set of crosspoints will be defined in the actual device. The presence of a crosspoint by itself does not imply that an electrical connection is present there or can be programmably created at that crosspoint. However, as is explained shortly, a set of crosspoints can be fully or partially populated by PIP's (programmable interconnect points) to thereby define a programmable switch matrix.

Interchangeability symbol 403 demonstrates the equivalence between a rectangle with insignia of the form 'Vn/Hm' in it, and a crossing of a Vn bus with an Hm bus, which crossing usually defines n times m crosspoints.

One-way interchangeability symbol 404 shows the formation of a partially populated, programmable switch matrix at the intersection of a Vn bus and a Hm bus. A peanut-shaped symbol such as 441 with a number in it, represents an exemplary set of partially populating PIP's. In this example a horizontally-extensive pattern of 3 PIP's is repeated vertically in a staggered and wrap-around manner so that in general, each H-line is loaded by a same respective and horizontally-associated number of PIP's (e.g., 3) and each V-line is loaded by a respective and same, vertically-associated number of PIP's (e.g., 2).

The routing function of the peanut-shaped symbol 441 can vary based on whether signal flow is bidirectional or unidirectional. In FIG. 4B, one-way interchangeability symbol 405 shows the case where each 3:1 peanut symbol 443 represents a 3-to-1 multiplexer (MUX) because signal flow is defined by 3 input signals (Hm') and one output signal 444. Configuration memory 445, any associated decoding of its bits, and the selection control port into the MUX are implied by symbol 443.

One-way interchangeability symbol 406 shows the case where each 1:3 peanut symbol 447 represents a 1-to-3 demultiplexer (DEMUX) because signal flow is defined by 3 output signals (Hm') and one input signal 448. Configuration memory 449 and the selection control port are implied by symbol 447.

One-way interchangeability symbol 407 shows how a PIP (represented by a hollow circle) might be implemented by a configuration-memory controlled switch 471. In one state, the PIP creates either a unidirectional or bidirectional connection between the crossing H and V-lines. In a second state, the PIP does not provide a connection between the crossing H and V-lines. Switch 471 may defined by any one or more of a plurality of elements, such as an NMOS pass transistor, a CMOS transmission gate, a blowable fuse or makeable anti-fuse, one or an opposed pair of tristate drivers, and so forth. Configuration memory 472 can be discrete from controllable switch 471 or an integral part of it, such as when switch 471 includes a floating gate transistor and the charge on the floating gate defines a configuration memory state.

One-way interchangeability symbol 408 shows how a GIP (a Gate Input Point, which is represented here by a hollow diamond) might be implemented by a memory controlled switch 481. In one state, the GIP creates a unidirectional connection between a crossing signal-providing line and a gate input line (GIL). In a second state, the GIP instead couples the gate input line (GIL) to a Gate-input doesn't-care state 'GiX'. If the gate on the output end of the GIL is an AND gate, then the don't-care state 'GiX' is a logic '1' because that allows other inputs of the AND gate to define its output. If the gate on the output end of the GIL is an OR gate, then the don't-care state 'GiX' is a logic '0' for similar reasons. Switch 481 may be defined by any one or more of a plurality of elements, such as an NMOS pass transistor with pull-up, a blowable fuse or makeable anti-fuse with pull-up, an open collector driver or a tristate driver with pull-up, and so forth. Memory 482 can be discrete from controllable switch 481 or an integral part of it, such as when switch 481 includes a floating gate transistor and the charge on the floating gate defines a memory state.

One-way interchangeability symbol 409a demonstrates for purpose of understanding symbolic equivalence, the relationship between a Vn rectangle with a Full-Diagonal symbol (FD peanut) 491 and a corresponding matrix of crosspoints that are populated by GIP's. The output 493 of AND gate 492 defines a product term (PT) of one or more of all n signals provided by the vertical longlines (V-LL's). The real or theoretical lines that cross with the V-LL's are sometimes referred to herein as shortlines (SL's) even though SL's might be longer than their LL's. Typically, LL's broadcast a set of available signals through an array of SL's. PIP's or GIP's on the SL's can programmably select a subset of the LL-broadcast signals and deliver the selected subset to an array of subsequent circuits (e.g., AND gates) provided along the longlines.

Those skilled in the art will recognize that the depiction to the right of symbol 409a is generally more symbolic than practical. One-way interchangeability symbol 409b demonstrates a more realistic implementation of an n-inputs AND gate. Here, the product term signal 493' is formed by a wired-AND circuit having a pull-up resistor. Each of NMOS floating gate transistors such as 498, 499, etc. receives a respective and pre-complemented one of the n input signals at its gate while its source is tied to ground and its drain is tied to pulled-up line 493'. If one of the pre-complemented input signals goes high, its transistor pulls line 493' low and thereby performs the Boolean ANDing function. Charge may be programmably and individually stored onto the floating gate of each of transistors 498, 499, etc., to define whether that crosspoint is active or not. If none of transistors 498, 499, etc. are active, then the pull-up resistor will pull line 493' high to Vcc. The wired-AND function may be alternatively performed by placing a sense amplifier at the end of line 493'. The sense amplifier is designed to produce a logic '1' output if none of transistors 498, 499, etc., is in a conductive state and to produce a logic '0' output if one or more of transistors 498, 499, etc., is in a conductive state.

In some instances, it may not be desirable to use a Full-Diagonal (FD) of crosspoint populating GIP's such as implied by FD peanut symbol 491. For example, if each input signal and its complement are simultaneously presented for input into a gate, then the theoretical number of gate input lines (GiL's) can be cut in half because both of the gate input signal and its complement will generally not be applied at the same time to a same AND gate or a same OR gate. Such a condition is illustrated in FIG. 4C, to the right of interchangeability symbol 410. Each of the illustrated, hollow bird symbols (421) represents a memory-controlled, 3-to-1 switch that couples the GiL either to supplied input signal or its complement or to a Gate-Input don't care level (Gix). The HD insignia at 495 represents such a Half-full Diagonal condition. The output 497 of AND gate 496 can be configured by the three-way switches (421) to be a product of any desired ones of the supplied input signals (a, a-NOT, b, b-NOT, etc.).

Those skilled in the art will recognize that the depiction to the right of 410 is generally more symbolic than practical. One-way interchangeability symbol 409b again demonstrates a more realistic implementation. For the HD embodiment, additional and like-connected transistors will typically be added onto line 493' to receive the non-complemented signals, a, b, c, d, etc. The n number of vertical input lines will therefore be twice as many as the up to n/2 number of terms that may be ANDed together by the circuit. This relationship between the Vn input lines and the n/2 independent terms that may be ANDed is indicated in FIG. 4C to the left of leftmost gate symbol 496 by the double-slash symbol and its 'n/2' descriptor.

One-way interchangeability symbol 420 shows how a three-state switch 421 might be formed so that configuration memory 422 determines whether input signal 'a' or 'a-NOT' or a don't care level (GiX) is applied to the gate input terminal line (GiL). If the receiving gate is an AND gate, then GiX='1'. At least two memory bits are generally needed to define the 3 states.

Those skilled in the art will recognize that a pair of transistors such as 498, 499 in the implementation shown below 409b can be used with a pull-up or pull-down resistor to emulate the operation implied at 420. For example, if an AND gate is being implemented, input signals a and a-bar (a-NOT) will be supplied respectively to the gates of transistors 498, 499. Three configuration memory states can be defined by disabling only 498 (receives 'a'), disabling only 499 (receives 'a-bar'), and disabling both of 498 and 499. If a fourth memory state is allowed where both of 498 and 499 are enabled, then the output 493' of the AND gate will be forced to zero because at least one of 'a' and 'a-bar' is zero.

Shown to the left of the next, one-way interchangeability symbol 430, there is a crown-shaped symbol 431 that essentially represents the inverse of the operation performed by gate-input element 421. The crown-shaped symbol 431 represents a one-to: as-many-as-N-points, programmable 'steering' switch that has one input point (IN) and a plurality of N output points (2 active ones in this example). Steering switch 431 is programmable to steer its input signal (IN) to at least one, programmably-selected one of its N output points while applying a predefined default level to each of the remaining of its N output points that are not specifically selected for receiving the input signal (IN). In other words, those of the N output points to which the IN signal is not specifically steered, will instead receive a respective default level (e.g., a GiX level). The one, or optionally more, of the N output points to which the IN signal is specifically steered, will receive the so-steered IN signal.

In the illustrated example of one-way interchangeability symbol 430, the two (N) output points of steering switch 431 are respectively, a first input terminal (GIL$_0$) of a first gate (not shown) and a second input terminal (GIL$_1$) of a separate second gate (not shown). Both of the first and second gates (not shown) have a same, input don't care level (GiX). For example, if the first and second gates (not shown) are OR gates, then GiX is a logic '0' and that becomes the default output level of the corresponding steering switch 431. Thus, if configuration memory 432 can only select only a specific one of the N output points at a time, say the first input terminal (GIL$_0$), then steering switch 431 will steer the input signal (IN) to GIL$_0$ while applying the don't care, default level (GiX) to the input terminal (GIL$_1$) of the second gate. If configuration memory 432 instead selects GIL$_1$, then the vice versa operation will be performed. The input signal (IN) will be steered to GIL$_1$ while GiX will be applied to GIL$_0$.

If desired, configuration memory 432 can be made larger such that it can programmably-select more than one of the N output points of the steering switch 431 while applying a default level to the remaining of its N output points. In the illustrated example therefore, configuration memory 432 might be organized as two bits instead of one, in which case memory 432 can be programmed to control each of the illustrated SPDT electronic switches independently. Typically, in CPLD's where pass transistors are used for implementing PIP's, and where configuration memory can be become excessively large if some restraint is not used, the configuration memory 432 of a steering switch 431 is limited to selecting just one of the N output points. One reason why it is desirable to steer the input signal (IN) to the input terminal of only one gate at a time is so that speed can be maintained without having to provide too large of a signal generating driver (not shown) that drives the IN terminal of steerer 431. Another reason is to keep the size of memory 432 relatively small.

Referring to FIG. 5, the illustrated super structure 500 is constituted by a Segment Switch Matrix (SSM) 550, and a cooperating part of Global Switch Matrix (GSM) 580, and a plurality of Super Logic Blocks, of which only SLB 510 is shown. Where practical, reference numerals in the '500' century series are used in FIG. 5 to refer to elements that have corresponding counterparts in FIG. 2, where the latter are identified by reference numerals in the '200' century series.

As such, the illustrated set 511 of eighty H-lines that emerge from SSM 550 represent the SLB input bus 511 for SLB 510. The illustrated set 522 of thirty-two MFB lines that emerge from macrocells area 512 carry the macrocell result signals (MFB's) of SLB 510 back to SSM 550 and also to GSM 580. Pad 516 is a representative one of the 16 I/O terminals of SLB 510. A preselected subset of the I/O pads 516 may be buried if desired. The 16-bit wide bus 517 corresponds to bus 217 of FIG. 2 and includes a connection to macrocells area (MCA) 512. IFB bus 517 merges into a 48-bits wide, combined feedback bus 528. Combined feedback bus 528 then merges into a 192-bits wide, combined, intra-segment feedback bus 529 which feeds into Segment Switch Matrix (SSM) 550.

SSM 550 is divisible into a local-feedback portion 551 (fed by bus 529) and a global-feedback portion 552 (fed from the GSM by bus 585). On each H-line of SLB input bus 511 there is a first, local-servicing, 8-to-1 multiplexer section 553 that is provided in the cross area of bus 511 with a V192 set of lines of the local-feedback portion 551. On each H-line of SLB input bus 511 there is also a second, global-servicing, 8:1 mux section 554 that is provided in the cross area with a V192 set of lines of the SSM global-feedback portion 552. The combination of sections 553 and 554 defines a 16-to-1 multiplexer.

The 16 PIP's per multiplexer 553/554 multiplied by the 80 SLB input lines (511) results in 1280 PIP's being present in the cross area of H80 bus 511 and V384 bus 551/552. Because the PIP's are generally uniformly distributed in this cross area, these 1280 PIP's provide, on average, 3.33 ways (1280/384) for a given signal on V384 bus 551/552 to enter SLB 510. In one embodiment, preference for routability is given to the IFB ones of signals carried on the V384 lines of bus 551/552 so that, for every triad of 2 MFB-carrying V-lines and 1 IFB-carrying V-line, there are 3 PIP's per SLB on each of the 2 MFB-carrying V-lines and 4 PIP's per SLB on the 1 IFB-carrying V-line. This combination of 10 PIP's per SLB for each corresponding triad of V-lines produces the average of 3.33 ways to route a signal from an SSM local line to a given SLB (10/3=3.33).

Each of the 8 PIP's in 8:1 mux section 553 is assigned a respective and mutually exclusive set of V24 lines among the lines of V192 bus 551. The V24 lines assigned to a respective PIP is called the SSM band 557 of that PIP. (8 PIP's per MUX_section×V24 lines per PIP_Band=V192 lines). As one steps down the H80 lines of SLB input bus 511, each PIP of the corresponding band shifts its position within its respective band 557 to thereby define the corresponding 8:1 mux section 553 of that H-line. The V24 lines of each PIP band 557 are further divided into a V16 subset for carrying MFB signals and a V8 subset for carrying IFB signals. This split matches the proportion in which SLB 510 produces MFB and IFB signals.

There are a further 640 PIP's in the cross area of H80 bus 511 and V192 bus 552. Because they are generally uniformly distributed, this second set of 640 PIP's provide, on average, 3.33 ways (640/192) for a given signal on V192 bus 552 to enter SLB 510. Other specifics relating to 8:1 mux section 554 and its respective PIP band 558 are essentially the same as those described for elements 553 and 557. As such, they need not be repeated here.

Up to eighty, independent, SLB input signals may be carried by H80 bus 511 into SLB 510. The SLB input signal on each of the H80 lines may be chosen from among a respective 16 of the 384 signals carried by the longlines of SSM 550. Each of the H80 lines is loaded by the electrical capacitance of its respective 16 PIP's plus the electrical capacitance of the one SSM longline to which one of multiplexer sections 553, 554 programmably couples the SSM shortline. Each of the V384 longlines of SSM 550 is loaded by the electrical capacitance of its 3.33 on average PIP's per SLB (e.g., 4 PIP's for longlines carrying IFB's, 3 for those with MFB's) times the number of SLB's in the given segment structure.

The eighty, independent, SLB input signals of bus 511 are supplied to a corresponding set of 80 complementary line drivers. Element 521 is an example of one such complementary line driver, and it has both a complementing output and a non-complementing output. The V160 output lines of the 80 complementary line drivers (521) enter area 531 to cross with 179 HD structures. Each HD structure of area 531 can supply a theoretical number of as many as 80 independent input signals to a respective one of AND gates, A0 through A178. Additionally, a nulling PIP 501 may be provided in reality or in theory for each of AND gates, A0–A178 for forcing the output its respective AND gate to zero. In general practice, the nulling PIP 501 will not be used, and instead one of the memory-controlled, 3-to-1 switches 421 (FIG. 4C) of each HD peanut may be replaced by a 4 state switch that further allows both a PT input term and its complement to be simultaneously applied to a respective pair of GiL's of the respective AND. Simultaneous application of the input term and its complement will force a zero output. This approach has been discussed above with respect to transistors 498 and 499.

Each of AND gates, A0 through A178 produces a respective one of product term signals, $PT_0$–$PT_{178}$. Each respective product term, $PT_i$ can represent the Boolean product of one or more of any of the 80 SSM signals acquired by SLB input bus 511 or their corresponding complements. Each respective product term, $PT_i$ can also be set to logic '0' if no input term is selected by the respective HD structure of crosspoint area 531 and if the respective nulling PIP 501 or its equivalent is activated. Each respective product term, $PT_i$ can also be set to logic '1' if no input term is selected by the respective HD structure of crosspoint area 531 and if the respective nulling PIP 501 or its equivalent is not activated.

A first subset of 160 of the product terms, $PT_0$–$PT_{159}$ are subdivided into 32 groups (clusters) of 5 PT's each, and are supplied as such to a corresponding set of 32 OR gates, OR0–OR31. Each of OR gates, OR0–OR31 produces a respective one of 32 sum-of-products signals, $SoP_0$–$SoP_{31}$. Each of the $SoP_0$–$SoP_{31}$ signals can therefore be expressed by the expressive form:

$$f_{SoP} = \Sigma^{N-5+} Xi \cdot (PTi^{Ki/Kmax-80/L1-(192\_Local/[8])+L2-(192\_Global/[8])}) \quad \{\text{Exp. B1}\}$$

where Xi=0 if the corresponding nulling PIP 501 is activated, Xi=1 otherwise, and PTi=1 if Ki is a null subset of Kmax.

Allocator 560 receives the $SoP_0$–$SoP_{31}$ signals and produces a derived set of 32 sums-of-sums signals, $SoS_0$–$SoS_{31}$. Allocator 560 can be programmably configured to cause $SoS_0$–$SoS_{31}$ to be merely copies respectively of the $SoP_0$–$SoP_{31}$ signals. Alternatively, allocator 560 can be designed and programmably configured to cause each respective $SoS_i$ signal to follow the expressive form:

$$SoS_i = \Sigma^M X_J \cdot SoP_J \quad \{\text{Exp. C}\}$$

where $X_J$=1 if the corresponding $SoP_J$ term is to be included in the sum-of-sums result $SoS_i$ and $X_J$=0 if not. M usually covers a range including the value J=i. Allocator 560 can have a wide variety of designs whose specifics are not directly germane to the over all architecture of the CPLD. In one embodiment, M covers a continuous range including the values J=i−3 and J=i+3 (see FIG. 6).

Each of the 32 macrocells in macrocells area (MCA) 512 will typically comprise an XOR gate that can dynamically or statically define the polarity of its respective $SoS_i$ signal. In accordance with DeMorgan's well known theorem, inversion of a Boolean sum (e.g., $SoS_i$) causes it to appear as a product of its complemented terms and vice versa. Each of the 32 macrocells will typically further comprise a storage unit for storing the polarity-adjusted $SoS_i$ signal. The storage unit can be fixed or programmably configured to behave as anyone of, for example, a D-type flip flop with single or dual edge triggering, a T-type flip flop (toggling on appropriate clock edge or flat), a latch, or a transparent pass-through element that passes its input directly to its output without substantial delay or alteration.

Figure 6:
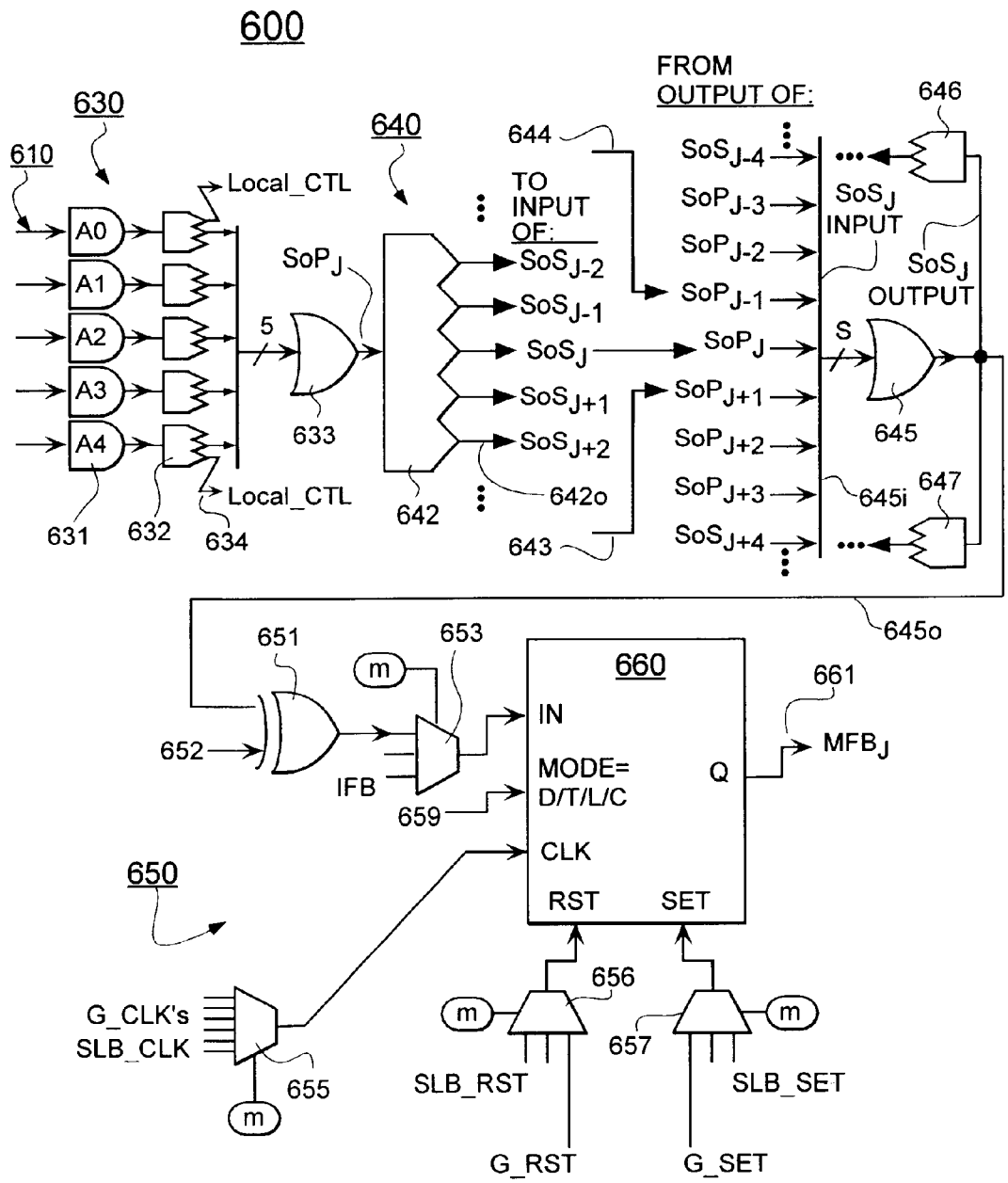
FIG. 6 is a schematic showing a general structure of a macrocell module that may be used within the SLB structure of FIG. 5.

FIG. 6 shows one example of a macrocell module 600 comprised of an input term signals acquiring means 610

(e.g., area 531), an AND/OR array 630, an allocator 640, and macrocell 650. Macrocell 650 and the remainder of module 600 constitute a Jth one of an array of like modules that are sequentially numbered, as for example in the sequence, J–3, J–2, J–1, J, J+1, J+2, J+3, etc.

The AND/OR array 630 comprises a first array 631 of five AND gates, A0–A4, a second array 632 of up to five PT-steering elements, and a first OR gate 633 which generates a respective sum-of-products signal, $SoP_J$, where the latter can be sum of as many as 5 PT's.

Each of the PT-steering elements 632 is a one-to-one-of-N steerer (N=2, 3, etc.) which can be programmably configured to either steer its respective PTi signal to an input terminal of first OR gate 633, or to supply a logic '0' (GiX=0) to that terminal of OR gate 633. If the respective PTi signal is not steered to OR gate 633, the PTi signal may be instead steered to an i-th local control within the Jth macrocell module 600. If the respective PTi signal is not steered to the i-th local control, then the respective PT-steering element 632 provides a predefined default control signal on the line 634 of that respective i-th local control.

The exact nature of each of the local controls that can respectively receive, up-to-all five of the steerable PT signals can vary and is beyond the scope of the present invention. By way of example though, one of the optionally re-directed PT signals that are steered through the local-control lines 634 of PT-steering elements 632 can be applied to a respective terminal 652 of a soon-described XOR gate 651. Others of the optionally re-directed PT signals can be respectively applied for controlling the polarity and/or edge-sensitivity of the CLK input of storage element 660. They can also be applied to a mode control 659 for causing element 660 to function as a desired one of a D-type flip flop (IN=D), a T-type flip flop (IN=T), a latch (IN=L), or a combinatorial pass-through element (IN=C), where in the last mode, C, the IN signal of element 660 is passed directly to Q output 661 without intermediate storage. Another application filed concurrently herewith or shortly after describes specific embodiments of macrocell module 600 that constitute a separate invention.

The $SoP_J$, sum-of-products signal of the first OR gate 633 is next supplied to a post-SoP steering element 642 of allocator 640. The $SoP_J$ signal can be steered to a memory-specified one (or optionally more) of the output destinations of steering element 642 while the remaining output destinations generally receive a don't care level, typically a logic '0'.

Module 600 includes a second OR gate 645 having a plurality of input terminals 645i for receiving $SoS_J$ input signals and an output terminal 645o for producing a respective $SoS_J$ output signal. Inputs 645i can come from other modules (e.g., J+1, J–1, etc.) as well as coming from the same Jth module 600.

For a first example, assume that the only inputs 645i of second OR gate 645 are those from the SoP outputs of modules J–3 through J+3. (This series includes J itself but pretends that the J+4 and J–4 elements of illustrated inputs 645i are not there for the moment.) Assume further that the respective post-SoP steering elements (642) of macrocell modules J, J+1 and J+2 steer their respective sum-of-products signals, $SoP_J$, $SoP_{J+1}$, $SoP_{J+2}$, to the input terminals 645i of the $SoS_J$ OR gate 645 while the respective post-SoP steering elements (642) of remaining modules, J+3, J–1, J–2 and J–3 steer their respective sum-of-products signals, $SoP_{J+i}$ elsewhere. As a result, the $SoS_J$ output signal on line 645o will represent the Boolean sum of $SoP_J$, $SoP_{J+1}$ and $SoP_{J+2}$. The $SoP_{J+1}$ term, for example, is supplied from the (J+1)th macrocell module by line 643. A GiX signal (a steady logic '0') will arrive from the (J–1)th macrocell module in this example by way of line 644. The delay for producing the sum-of-three sums result of this example, $SoS_J=SoP_J+SoP_{J+1}+SoP_{J+2}$ will be simply the parallel gate delays through elements 630 and 642 of all modules plus the gate delay of second OR gate 645 in module J.

Note that the $SoS_J$ output of OR gate 645 can be optionally fed through one or both of post-SoS steering elements 646 and 647 to other macrocell modules. Similarly, every Nth-away macrocell module such as J–4k and J+4k (where k=1, 2, 3, etc.) can steer its respective $SoS_{J+ik}$ output to inputs 645i of macrocell module J.

By way of a second example, assume that the inputs 645i of OR gate 645 now include not only the SoP outputs of modules J–3 through J+3 but also the illustrated SOS steered outputs of modules J–4 and J+4. (Note the subtle but important difference between SoS outputs 645o and SoP outputs 642o here. SoP outputs are produced by the first OR gate 633 of their respective macrocell module while SoS outputs are produced by the second OR gate 645 of their respective macrocell module.)

Assume further for the second example that the respective post-SoP steering elements (642) of macrocell modules J and J+2 steer their respective sum-of-products signals, $SoP_J$, $SoP_{J+2}$, to the input terminals 645i of the SoS OR gate 645 while the respective post-SoP steering elements (642) of remaining modules, J+1, J+3, J–1, J–2 and J–3 steer their respective sum-of-products signals, $SoP_{J+i}$ elsewhere. Assume yet further, that a post-SoS steering element (646) of macrocell module J+4 steers its respective sum-of-sums signal, $SoS_{J+4}$ to a corresponding one of the input terminals 645i of the $SoS_J$ OR gate 645 while the post-SoS steering element (647) of macrocell module J–4 steers its respective sum-of-sums signal, $SoS_{J-4}$ elsewhere. As a result, the $SoS_J$ output signal on line 645o of macrocell module J will represent the Boolean sum of $SoP_J$, $SoP_{J+2}$, and $SoS_{J+4}$. The sum-of-sums output, $SoS_{J+4}$ of macrocell module J+4 is thereby cascaded into an input 645i for the SoS OR gate 645 of macrocell module J. Unlike the first example, the delay for producing this result will include parallel gate delays through elements 630 and 642 of modules J+4 and J, plus serial gate delays through elements 645 and 646 of modules J+4 and J. However the number of Boolean sums that can be represented by the $SoS_J$ output signal (645o) includes the number of Boolean sums that can be represented by the $SoS_{J+4}$ output signal. As such, complexity of resultant sums can be greatly increased. The cost, of course, is the delay penalty of serially cascading macrocell modules such as J+4 (not shown) and J.

$SoS_J$ output signal (645o) is supplied to one input of XOR gate 651 while a polarity control signal 652 is supplied to the other input. The polarity-adjusted result can be routed to the D-or-T-or-L-or-C input of storage/pass-through element 660 by way of multiplexer 653. Alternatively, multiplexer 653 can route a desired IFB signal (I/O feedback) of the SLB or another kind of signal to the D/T/L/C input (IN) of element 660. In one embodiment, respective ones of the 16 IFB signals are fed one to each of two of the 32 macrocell modules such that each IFB signal can be stored in either selected one or both of two macrocell modules. The Q output of storage element 660 becomes the $MFB_J$ (macrocell feedback) signal 661 of the corresponding macrocell module J.

The clock, reset and set terminals of storage element 660 receive respective control signals by way of respective multiplexers 655, 656 and 657, each of which is configured by a respective part of configuration memory. The routed clock, reset and set signals can respectively include G_CLK's (up to 4 of them), SLB_CLK, SLB_RST and SLB_SET signals. FIG. 5 shows that these SLB_CLK, SLB_RST and SLB_SET signals can be produced by respective AND gates A160, A161 and A162 as independent PT signals. The default is a logic '0' if PT signals are not so-used for respectively generating the SLB CLK, SLB_RST and SLB_SET signals.

Continuing in FIG. 5, the 32 MFB result signals (bus 522) of macrocells area 512 can be passed through an Output Switch Matrix (OSM) 570 for application to programmably-selected input terminals of 16 tristate drivers 526 of the SLB 510. Respective output enable (OE) terminals of tristate drivers 526 are driven by independent PT signals produced by respective AND gates A163–A178 of SLB 510. Each of the 16 tristate drivers 526 may have an independently configurable slew rate (control not shown).

The illustrated OSM 570 is structured as a H32+/V16 partially-populated switch matrix. (The H32+ part indicates that there optionally may be more than 32 horizontal lines, as will be explained.) Multiplexer size may be in the range of 4:1 through 16:1. Thus each I/O pad 516 can have an MFB signal programmably routed to it from any one of, between 4 to 16 macrocells of the same SLB (or optionally from other macrocells of other SLB's). The OSM 570 gives CPLD configuring software flexibility in placing a particular function in one macrocell and then routing it to a desired output pad 516. This feature may be used for realizing re-design PinOut-Consistency (re-design Pin-Retention™'). A same I/O pad may be used for a given function even though re-design causes the CPLD configuring software to shift the placement of the implementing macrocell within the SLB. The dashed plurality of $MFB_{i\pm1}$ lines 523 represent an optional addition of more horizontal shortlines that may be added into the H32+ parameter of OSM 570 so that pad 516 may receive MFB outputs from neighboring SLB's if desired. Of course this can disadvantageously increase die size and propagation time through the OSM.

Combined signal bus 528 is formed, as already explained, by combining the 32 MFB signals of bus 522 with the 16 IFB signals of bus 517 to thereby provide 48 feedback signals (MFB+IFB) per SLB. Each bus 528 of each of four SLB's in a segment (201 in FIG. 2) are combined to define the 192 lines of bus 529. Bus 529 feeds into the V192 bus 551 of SSM 550. V192 bus 551 can therefore simultaneously carry all the feedback signals (MFB+IFB) of the four SLB's 210–240 of its segment. Intra-segment communications can therefore be provided at the full 100% level irrespective of what happens at the inter-segment (global) communications level. In other words, each segment can operate as its own, fully contained and independent mini-CPLD. The partially-populated cross areas of each of four SLB input buses (511) and the local V192 bus 551 gives each locally-generated feedback signal (MFB or IFB), on an average, 3.33 ways of being fed from any one SLB to the same or another SLB of the same segment (201). That means at least 3-ways for every signal and 4-ways for some signals (e.g., IFB's). This gives CPLD configuring software a wide latitude in picking routings for intra-segment communications and helps to shorten the job completion time of the CPLD configuring software.

Figure 7A:
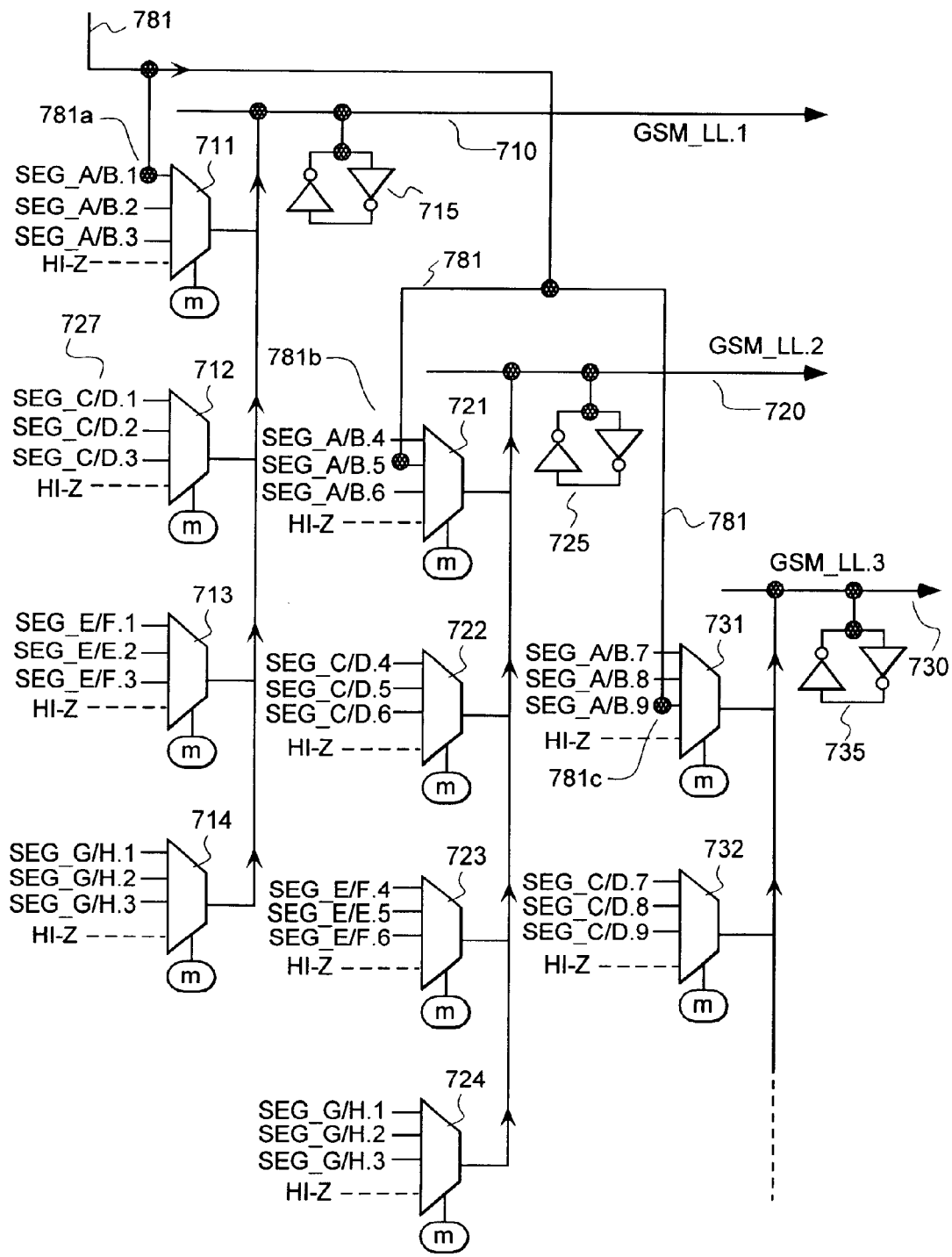
FIG. 7A is a schematic showing a method for distributively multiplexing the SLB outputs of eight segments onto lines of a GSM.
Figure 7B:
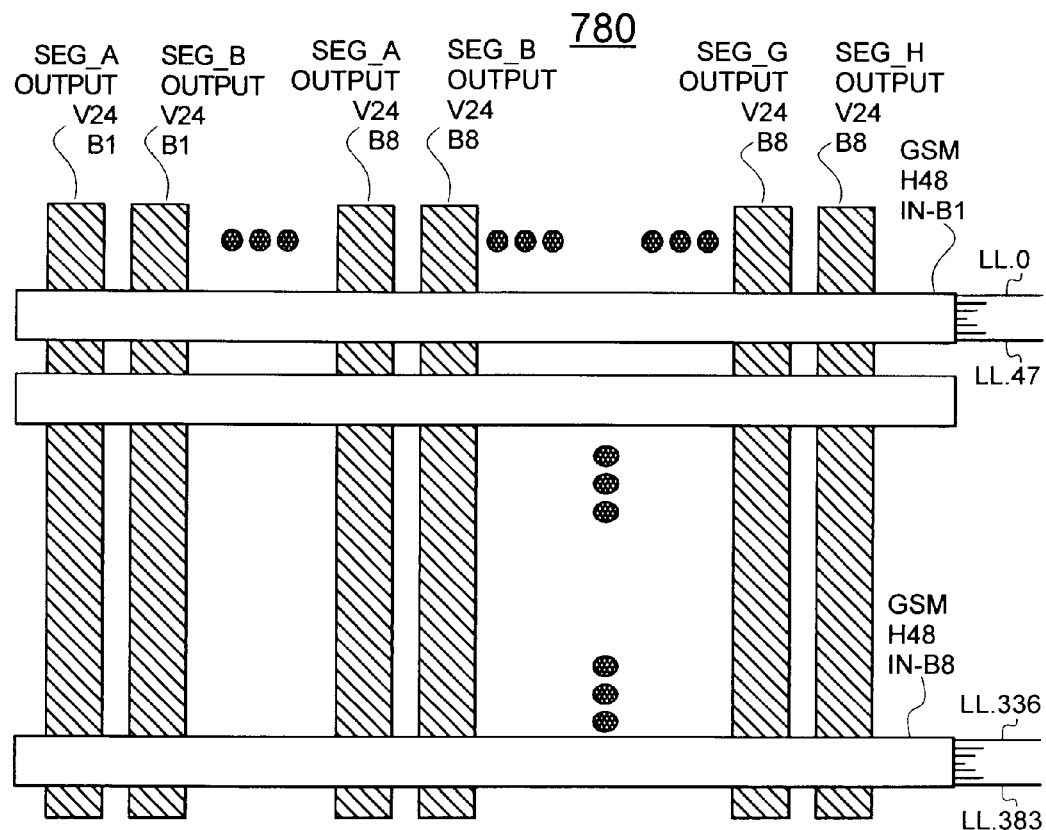
FIG. 7B shows a banding scheme that may be used in conjunction with the distributive multiplexing method of FIG. 7A.

Each of the 48 lines of bus 528 further feeds into a respective 1:3 demultiplexer on GSM 580. Peanut symbol 583 represents one such 1:3 demultiplexer among a plurality of like but staggered demultiplexers. Line 581 represents an exemplary, GSM-feeding line among the 48lines of bus 528. The splitting of bus 528 into two bands of 24 lines each is shown at 527 merely to allude to a segment-intertwining technique that will be discussed when FIGS. 7A–7B are examined. In one embodiment, the 1:3 DEMUX 583 couples to respective longlines of the GSM such as line 587 by passing its respective, demultiplexed signal 581 through a configurable multiplexer 584 that can further receive other like demultiplexed signals from the respective other 1:3 demultiplexers (583) of other segments. The output of exemplary multiplexer 584 is applied to a tristate longline driver such as 586. While not explicitly shown in FIG. 5, it is to be understood that each GSM longline (e.g., 587) will generally have a plurality of tristate longline drivers such as 586 distributively coupled to the GSM longline for driving their respective signals (e.g., 581) onto the GSM longline. Contention may be avoided on each GSM longline by enabling no more than the output of one such tristate longline driver at a time for the given longline. The OE (output enable) control terminals of the tristate longline drivers 586 may be controlled either statically by configuration memory or dynamically by applying steered product terms to such OE control terminals. The embodiment shown in FIG. 7A uses static control.

The 384 horizontal longlines of GSM 580 (of which 587 is an exemplary one) cross with the 192 vertical shortlines of bus 585. The 384 times 192 resulting crosspoints are partially-populated by 8:1 multiplexers such as 588. Signal routability from any given GSM line such as 587 to a desired SSM (e.g., 550) is therefore 192×8 divided by 384, or 4-ways per GSM H-line. Signal routability from any given GSM-feeding line such as 581 to a desired segment (e.g., SSM 550) is the product of the 3-ways per GSM V-line provided by DEMUX 583 times the 4-ways per GSM H-line provided by multiplexers 588, which gives a result of 12-ways. In other words, when CPLD configuring software wants to route a given GSM input (e.g., on line 581) to a specified segment (e.g., that of SSM 550), the software has a total of 12 different paths to choose from. If one is already consumed for servicing another signal, then the software can try another path and another until all 12 are exhausted. Thereafter, the CPLD configuring software can try re-routing the signal to another GSM input (e.g., the next one after line 581). This re-try can including shifting non-critical signals (where speed is not as important) through OSM 570 and IFB bus 517. Note that OSM 570 provides additional routing flexibility. This factor multiplies with the 12-ways provided through the GSM when IFB signals are being considered and Pinout-Consistency is not needed, such as when an IFB signal moves through a buried pad 516. Thus it is seen that CPLD configuring software is given a relatively wide range of routing possibilities by the N-way routing options provided in one or both of the local feedback loops (529) and global feedback loops (585). Moreover, because a consistent, same first delay can be provided in the L1 loops (529, 551) and a respectively consistent same second delay can be provided in the L2 loops (580, 585, 552), it is relatively easy for the CPLD configuring software to provide Speed-Consistency.

External signals can be fed into the CPLD from the pins of nonburied ones of pads 516. The input path of such externally-supplied signals can be purely intra-segment, such as moving from pad 516, through input buffer 536 and through IFB bus 517 directly to macrocells area 512. For the embodiment of FIG. 6, this direct path 517 into MCA 512 continues into multiplexer 653. The externally-supplied signal can then be temporarily stored in element 660 for synchronization with a chip-internal clock (655) or it can be passed through asynchronously onto MFB bus 522 if storage element 660 is in one of the latch (L) or combinatorial (C) modes.

The input path of an externally-supplied signal can additionally or alternatively be a global one (inter-segment). The signal can propagate from pad 516, through input buffer 536 and through a GSM-feeding line 581 into the Global Switch Matrix 580. From there, it can be broadcast into any one or more segments, as desired, by way of the 192 per segment, 8:1 multiplexers 588.

A summarizing review of FIG. 5 shows that, in accordance with the invention, an improved and scalable CPLD architecture has been developed that features a two-tiered hierarchical switch matrix construct which helps CPLD configuring software to provide Speed-Consistency and/or PinOut-Consistency. The two-tiered hierarchical switch matrix construct has a Global Switch Matrix (e.g., GSM 580) and a plurality of Segment Switch Matrices (e.g., SSM 550). Coupled to each SSM is an even plurality of at least four programmable logic blocks (e.g., SLB 510, see also 210–240 of FIG. 2). Each SSM and its even number of SLB's define a segment (201) that couples to the GSM for both injecting SLB result signals 522 and/or I/O pin input signals 517 into (528, 581) the GSM and for extracting (588) globally-provided signals (585) from the GSM for input (511) by way of the SSM 550 into each SLB of a given segment.

Each SLB has at least 80 complementable inputs (521) and can generate product term signals (PT's) that are Boolean products of as many as 80 independent input terms. With use of allocation (560, 640), large sums of such large PT's may be produced in each SLB. Each sum-of-products signal (MFB 522) can take on the expressive form:

$$f_{SoP} \Sigma^{N-5+}(Xi \cdot PTi^{Ki}/80/(192/8\text{Local}+192/8\text{Global})) \quad \{\text{Exp. B1'}\}$$

Some of the product terms generated within each SLB are dedicated to SLB-local controls such as SLB-wide clock, set and reset controls (A160–A162) and such as I/O drive enable controls (A163–A178).

Each SLB has at least 32 macrocells and at least 16 I/O pads (buried or nonburied) which feedback to both to the local SSM (by way of path 528) and to the global GSM (by way of path 527). Each SSM has dedicated for intra-segment communications, at least as many longlines (48×4) as there are macrocells (32×4) and I/O pads (16×4) in the segment, thereby assuring that every macrocell signal (MFB) and I/O signal (IFB) can be simultaneously transmitted through the SSM. Each SLB has at least 3 ways (553) of transmitting a feedback signal through its local SSM and then back to either itself or another SLB of the same segment. CPLD configuring software is thereby given good flexibility to route intra-segment signals.

Each SSM further has, as dedicated for inter-segment (global) communications, at least as many longlines (552) as there are macrocells and I/O pads in the segment, thereby assuring that every macrocell signal (MFB) and I/O signal (IFB) can be simultaneously transmitted through the GSM from one segment to another segment. The GSM has at least as many longlines for inter-segment (global) communications as do two SSM'S. Thus 100% inter-segment (global), unidirectional communications may occur simultaneously between each of two pairs of segments. In other words, four segments may be fully intercoupled through the GSM on a pair-wise basis. Each SLB has at least 12 ways of transmitting a feedback signal (MFB or IFB) through the GSM and then back to either its own segment or another segment.

The 80 parallel inputs (511) of each SLB ease implementation of 64-bit wide designs. Each segment has at least 64 I/O pads (516). Symmetry within the design of each segment allow for more finely-granulated implementations such as for 32 or 16-bit wide designs.

A convenient migration path is therefore provided by one unified architecture for implementing 16-bit wide designs (e.g., bus 122 of FIG. 1), and/or 32-bit wide designs (e.g., bus 127 of FIG. 1), and/or 64-bit wide designs (e.g., bus 112 of FIG. 1).

FIG. 7A illustrates one subsystem 700 that may be used for distributively multiplexing the segment output signals of 8 segments onto respective longlines of the GSM while providing the 1:3 demultiplexer function of element 583. Three exemplary GSM longlines are shown at 710, 720 and 730 (GSM_LL.1, GSM_LL.2 and GSM_LL.3 respectively). Line 781 corresponds to 581 of FIG. 5. As seen, GSM-feeding line 781 has 3 drop points into subsystem 700, respectively identified as drop points 781a, 781b and 781c.

The full GSM will have a total of 3 drop points per GSM-feeding line (781) times 192 such feeding lines per segment times 8 segments (for the embodiment of FIG. 3). This large number can be factored as 384 times 12. Given that there are 384 longlines in the GSM of the illustrated embodiments, each GSM longline will need to service 12 drop points.

It is desirable to distribute the 12 drop points of each GSM longline such that all 8 segments (A–H) are serviced uniformly and with minimal delay. The number, 8 does not divide integrally into 12. However, the number, 4 does. If the 8 segments (A–H) of the illustrated embodiments are re-grouped as pairs, then we obtain 4 such pairs. Any pairing arrangement may be used. Because in FIGS. 3A–3B, segment A is vertically aligned with and adjacent to B, C is adjacent to D, and so forth, the following pairings were made: A/B, C/D, E/F and G/H. An alternate embodiment of FIG. 3A might use the following pairings: A/C, B/D, E/G and F/H.

In FIG. 7A, four 3:1, tri-stateable multiplexers are used for each GSM longline. GSM_LL.1 (710) for example, is serviced by the respective, 4 tri-stateable multiplexers, 711, 712, 713 and 714. GSM_LL.2 (720) is serviced by respective multiplexers, 721, 722, 723 and 724. GSM_LL.3 (730) is serviced by respective multiplexers, 731, 732, 733 and 734. And so on.

Each of the 3:1, tri-stateable multiplexers (e.g., 711) has two configuration memory bits for defining a corresponding set of four states, namely, (1) select input 0.1 for output, (2) select input 0.2 for output, (3) select input 0.3 for output, and (4) cause the output to go into a high-impedance (HI-Z) state. The use of four 3:1, tristateable multiplexers with two configuration memory bits each was a design choice which increases the number of configuration memory bits beyond the minimal needed in order to gain faster signal propagation speed. In one embodiment, propagation time through the GSM, including through subsystem 700 is about 2 to 2.5 nS. In the same embodiment, intra-segment signal propagation time from one pin to another is about 7 to 7.5 nS. Referring to momentarily FIG. 8, if global routing is to be used (through the GSM 580) to connect a pin 516a of a first segment (e.g., A) to an SLB (e.g., 510H) in a different segment (e.g., H), then pin-to-pin propagation time can still be as low as about 9 to 10 nS or less.

Figure 7C:
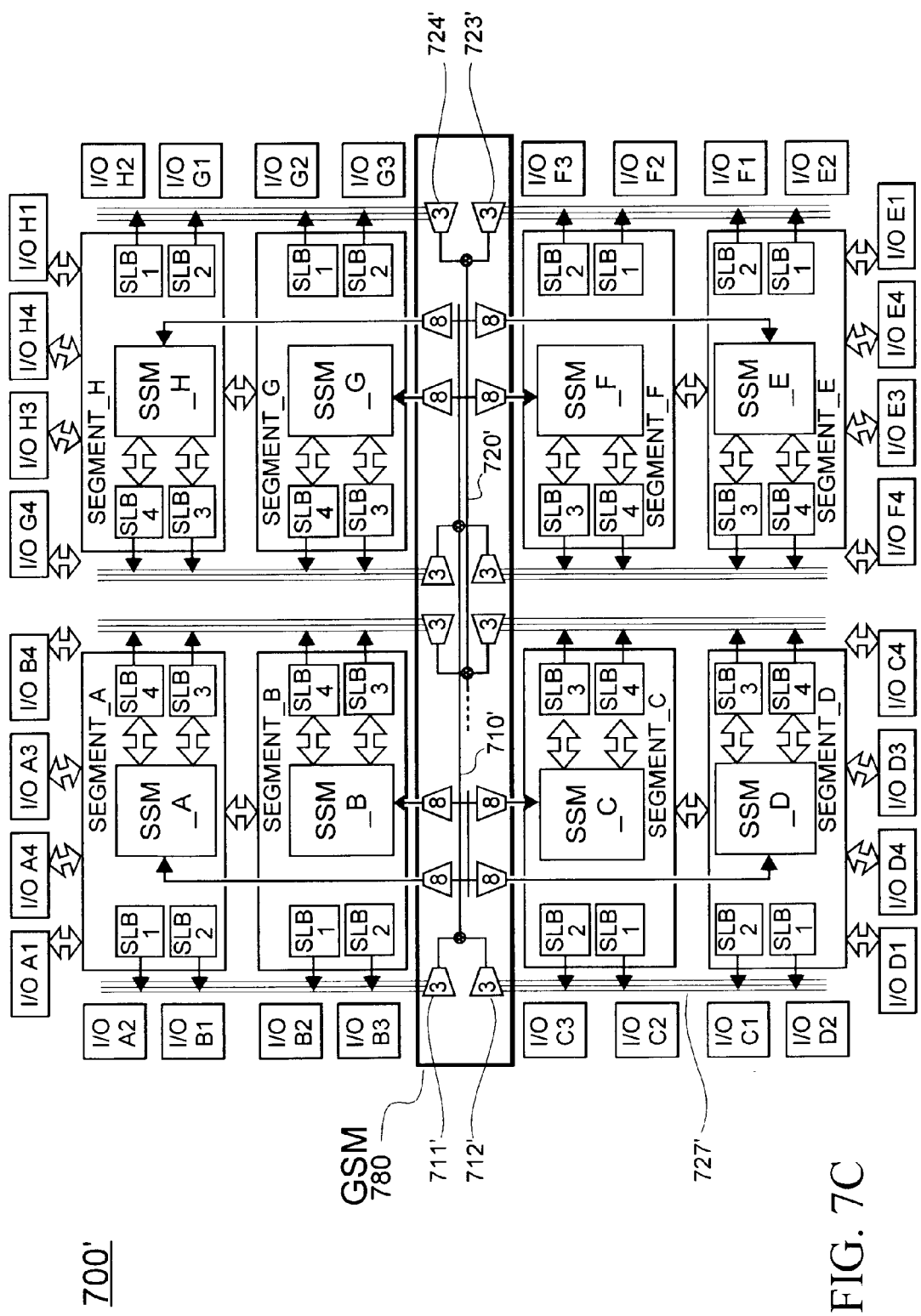
FIG. 7C is a block diagram corresponding to FIG. 3B and further showing how the distributive multiplexing methods of FIGS. 7A and 7B may be implemented in the second CPLD of FIG. 3B.

An alternate embodiment for FIG. 7A can use a 13 state, tristateable multiplexer having four configuration memory bits instead of the 8 consumed by, for example multiplexers 711–714. The first 12 states would select a respective one of the 12 drop points while the 13th state would be the HI-Z output state. However, signal propagation time through such a 13 state, tristateable multiplexer might be longer. More specifically, FIG. 7C shows how a distribution of four 3:1 multiplexers (with HI-Z as a fourth state for each) can help to reduce the length of lines for bringing SLB output signals down into the GSM 780. One exemplary GSM line 710' has multiplexers 711' and 712' respectively feeding it from segment pairs A/B and C/D. Another exemplary GSM line 720' has multiplexers 723' and 724' respectively feeding it from segment pairs E/F and G/H.

Wires 727' correspond to the band-intertwined bus 527 of FIG. 5. Bundle 727 is also seen as coming from the C/D pair in FIG. 7A.

As should be obvious from FIG. 7A, each of multiplexers 711–714 services a respective one of the four segment pairs, A/B, C/D, E/G and G/H. Line 781 obviously comes from the A/B segment pair. For multiplexer 711, two other lines of the A/B segment pair attach to the drop points designated as A/B.2 and A/B.3. For multiplexer 721, two other lines of the A/B segment pair attach to the drop points designated as A/B.4 and A/B.6. For multiplexer 731, two other lines of the A/B segment pair attach to the drop points designated as A/B.7 and A/B.8.

It is possible that some GSM longlines may go unused. For example, if all of multiplexers 711-714 are placed in the HI-Z state, line 710 might float and propagate noise through the chip. To prevent such an undesired condition, weak latches such as 715, 725, 735 are coupled to the respective longlines. The outputs of these weak latches (715, 725, 735, etc.) are designed to be easily overcome by either a logic '0' or logic '1' output of one of the multiplexers (e.g., 711–714) of the respective GSM longline. The input inverter of each such weak latch has enough gain to ensure bi-stable operation. If desired, the output inverter of each such weak latch may be individually skewed to favor latching towards ground or towards Vcc. The skewing selection depends on which of the GND and Vcc buses is better suited at that local in the chip for absorbing switching noise.

FIG. 7B illustrates an intertwining technique that may be used to pair together bands of MFB/IFB output lines from each segment pair. In the illustrated embodiment 780, the 192 GSM-feeding lines of each segment (A–H) are divided into bands of 24 lines each. A first V24 output band, B1 of segment A is laid out adjacent to a corresponding first V24 output band, B1 of segment B so as to define a V48 intertwined band. In a slightly varied embodiment, a first 3 wire bundle is taken from SLB__A1 and laid out adjacent to a second 3 wire bundle taken from SLB__A2, where the latter is laid out adjacent to further 3 wire bundles from SLB__B1 and SLB__2 so as to define a first quarter (12 wires) of the V48 intertwined band. The other three quarters repeat a similar pattern and may take their 3 wire bundles further from SLB__A3, A4, B3 and B4. There are 4 such V48, intertwined output bands per segment (4×48=192). The GSM is also subdivided into bands of 48 H-LL's each. There are 8 such H48, signal-receiving bands (8×48=384). GSM longlines are designated as LL.0 through LL.383 here. Signal-receiving band B1 for example, is formed by GSM longlines LL.0 through LL.47. As will be seen in FIG. 9A, these GSM longlines may be seen to formed different bands for output purposes.

PIP's (not shown) are distributed in the cross areas of the V24 and H48 bands of FIG. 7B to implement the distributed multiplexing functions shown in FIG. 7A.

The band intertwining technique helps to reduce the length of interconnect lines needed for transmitting GSM-feeding signals (e.g., 581) from respective segments to corresponding ones of the longline-driving multiplexers (e.g., 711–714) of each GSM longline (e.g., 710). This may be seen in the layout of FIG. 7C.

Figure 8:
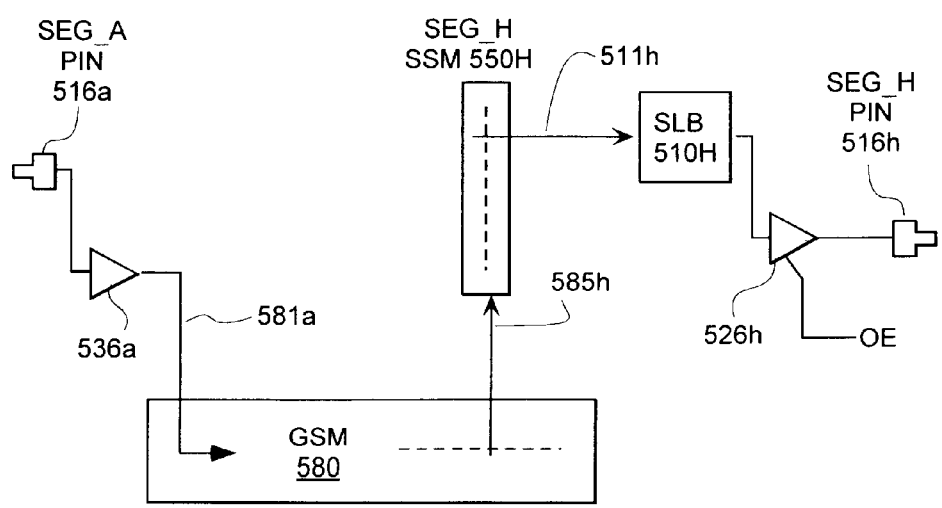
FIG. 8 is a schematic showing how one segment may borrow I/O pins from other segments while maintaining Speed-Consistency and/or PinOut-Consistency.

FIG. 8 shows a usage of the embodiment of FIG. 5 where a pin 516a (and corresponding nonburied pad) in segment SEG__A provides an input signal for an SLB 510H in different segment SEG__H. Signal propagation is through pin 516a, then the corresponding input buffer 536a of that pad, then through a corresponding GSM-feeding line 581a, the GSM 580, and out onto bus 585h into SSM 550H of segment SEG__H. From SSM 550H, the signal continues along SLB input bus 511h into respective SLB 510H. A corresponding IFB result signal is then passed through pad driver 526h to pin 516h.

As already explained, the difference in delay between acquiring external input signals from an out-of-segment pin such as 516a instead of from an intra-segment pin is that of propagating the signal through GSM 580. Otherwise, for the balanced local/global design of FIG. 5, the delay through the out-of-segment input buffer 536a is essentially the same as it would be for an intra-segment buffer, and the delay through the global portion (552) of SSM 550H is essentially the same as it would be through the local portion (551). Thus, is the pin-to-pin delay for processing signals only within a segment is about 7.5 nS or less, and the propagation delay through GSM 580 is about 2.5 nS or less, then the combined delay for the circuit configuration shown in FIG. 8 is SpeedLockable one of about 10 nS or less.

There are two more features to be associated with FIG. 8, PinOut-Consistency and pin/pad borrowing. Let us assume that pin 516ahas already been specified to provide a particular, board-level function. The pinout location for that frozen function cannot be changed anymore in this example. However, the CPLD configuring software finds that the best placement for an SLB which is to use the signal of pin 516a, is in segment SEG__H.

The placement does not have to be specifically at SLB position 210H (see FIG. 2). It could be at 220H, 230H or 240H. Element 516h may be either a pin or a buried pad (no connection to a pin) in this example. Because 12-way routability is available from the pre-specified pin 516a and through GSM 580 to get to SSM 550H, the CPLD configuring software should have a relatively easy task of finding a workable placement and routing solution. If 516h is a pin rather than a buried pad in this example and the location of pin 516h is also frozen, then obviously the degrees of freedom that the software has will be reduced. Nonetheless, the CPLD configuring software should have a relatively easy task of finding a workable routing solution.

Still referring to FIG. 8, let us assume that segment SEG__H needs to participate in a one-pass operation that calls for receipt over SLB input bus 511h of 80 external input signals from a corresponding 80 pins and that each segment has 64 nonburied pads. For this example, the desired output from SLB 510H is a MFB, not an IFB. Thus pin 516h is free to function as an input pin. The local portion 551 of SSM 550H can collect 64 external input signals from the corresponding 64 pins (including pin 516h) of its segment SEG__H. Up to sixteen additional pins can be 'borrowed' from one or more other segments using the technique shown in FIG. 8. Thus all 80 SLB input lines of bus 511h can simultaneously receive external input signals so that SLB 510H can process them in one pass.

If it were not possible to route the 80 external input signals to SLB 510H for one-pass processing, then the implementation might have to use two or more processing passes to generate the desired output function. This can significantly slow the throughput of the design-implementing CPLD. The exemplary architecture of FIG. 3, however, can transfer as many as 80 external input signals per receiving segment to as many as 24 receiving SLB's (that is, six receiving segments and two, pin donating segments) by using all 384 GSM longlines for pin borrowing (16×24=384) and by borrowing 96 pins (6×16=96) from the remaining, pin donating segments. More specifically, if each of segments A, B, C, D, E and F needs a mutually exclusive set of 80 I/O pins for receiving input signals, then segment G can donate 64 of its I/O pins (assuming they all its pads are nonburied) and segment H can donate 32 of its I/O pins. Segment H would then still have 32 I/O pins remaining for pumping out result signals. While this is an extreme, it demonstrates the robustness of the CPLD architecture disclosed herein.

Figure 9A:
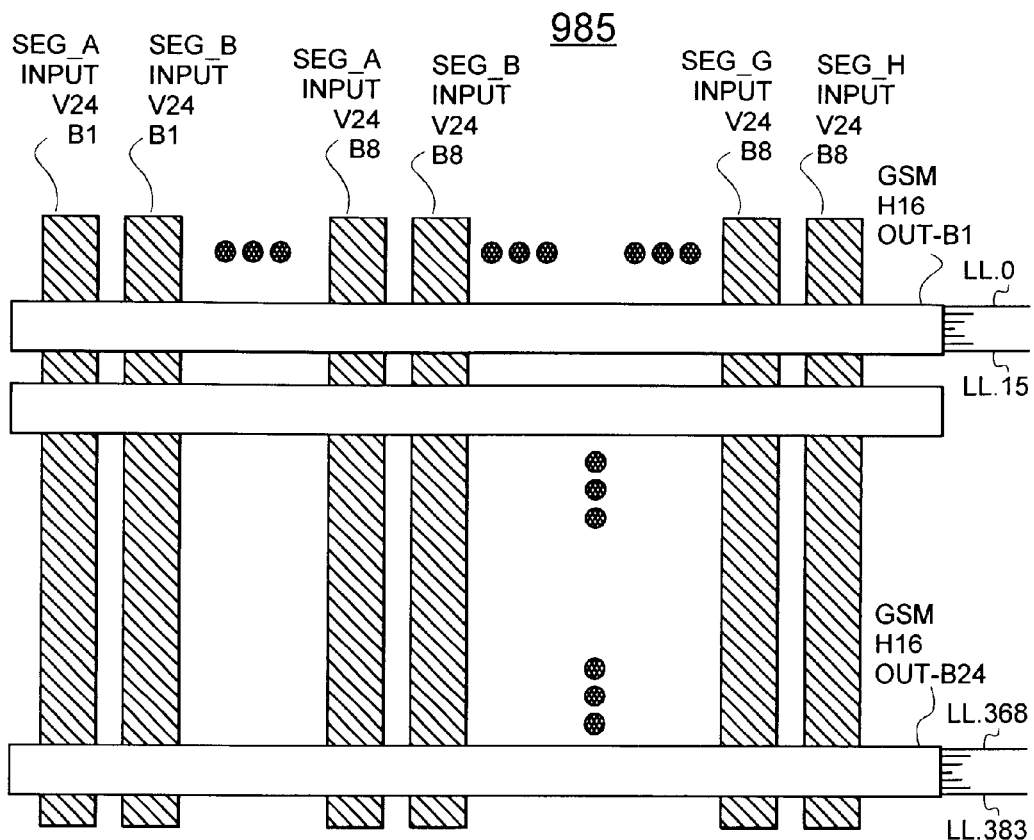
FIGS. 9A–9B are schematics showing a sliding bands scheme that may be used to uniformly distribute feedback from the GSM to respective SSM's and thereby avoid routing congestion.

FIG. 9A shows a banding scheme 985 that may be used for distributing GSM-carried, global signals back to respective SSM's of different segments. In the illustrated embodiment 985, the 192 SSM-feeding lines that extend from the GSM to each segment (A–H) are divided into bands of 24 lines each. A first V24 input band, B1 of segment A is laid out adjacent to a corresponding first V24 input band, B1 of segment B to thereby define a V48 intertwined band. There are 4 such intertwined input bands per segment (4×48=192). (A slightly different layout is shown in FIG. 9E and discussed below.) The GSM is also subdivided into bands for purposes of distributing its global signals to the SSM's. The GSM output bands have 16 H-LL's each. There are 24 such H16, signal-sourcing bands (24×16=384). GSM longlines are again designated as LL.0 through LL.383 here. Signal-sourcing band B1 for example, is formed by GSM longlines LL.0 through LL.15.

PIP's (not shown) are distributed in the cross areas of the V24 and H16 bands of FIG. 9A to implement a distributed multiplexing function that is next described with reference to FIG. 9B. The band intertwining technique helps to reduce the length of interconnect lines needed for transmitting GSM-sourced signals (e.g., 585) from the GSM to respective segments.

A further technique for reducing the length of interconnect lines needed for transmitting GSM-sourced signals to respective segments is shown in FIG. 9E and will be discussed below. In FIG. 9A, a plurality of 8:1 multiplexers are defined and distributed relative to GSM and SSM lines to reduce total line length and to provide CPLD configuring software with uniformly distributed routing options. The distributed, multiplexer-based routing of signals from the GSM lines into SSM lines may be seen at a gross level in the layout of FIG. 7C. SSM's A, B, C, D are vertically aligned in this embodiment with perpendicularly-extending output lines of first set of 8:1 multiplexers. SSM's E, F, G, H are vertically aligned in this embodiment with similar output lines of second set of 8:1 multiplexers. Distance from the horizontal lines of the GSM to the vertical lines of the SSM's is thereby minimized.

Figure 9B:
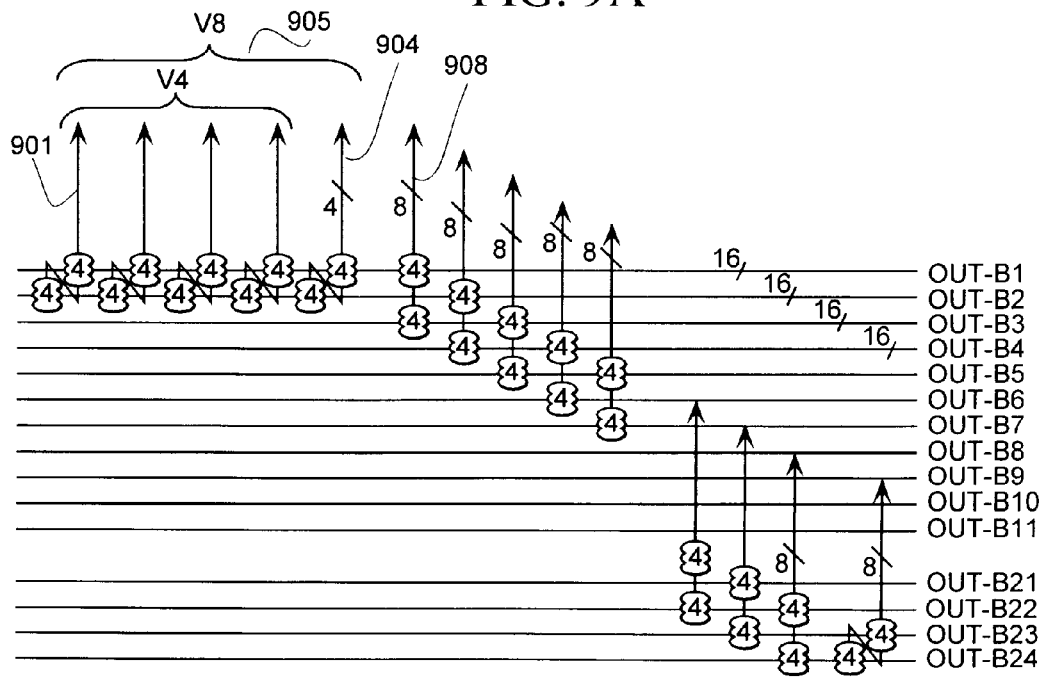

FIG. 9B shows more detail for implementing one version of the SSM-feeding 8:1 multiplexers. Line 901 is a single output line of one such 8:1 multiplexer. A first subset (e.g., four) of the 8 corresponding PIP's are distributed over a corresponding subset of the 16 horizontal lines of GSM output band B1. A second subset (e.g., four) of the 8 corresponding PIP's of the same MUX 901 are distributed over a corresponding subset of the 16 horizontal lines of GSM output band B2. (The illustration showing 4 PIP's in each GSM output band is just a simple introduction to a concept that will be further elaborated below.) This pattern of distributing 8 PIP's across two assigned, GSM output bands is repeated three more times with each of the repeats being vertically distributed differently. In the illustrated, simple example, the differently distributed PIP's are shown as being staggered to cover mutually exclusive, subsets of 4 of the 16 horizontal lines of respective GSM output bands B1 and B2.

Figure 9C:
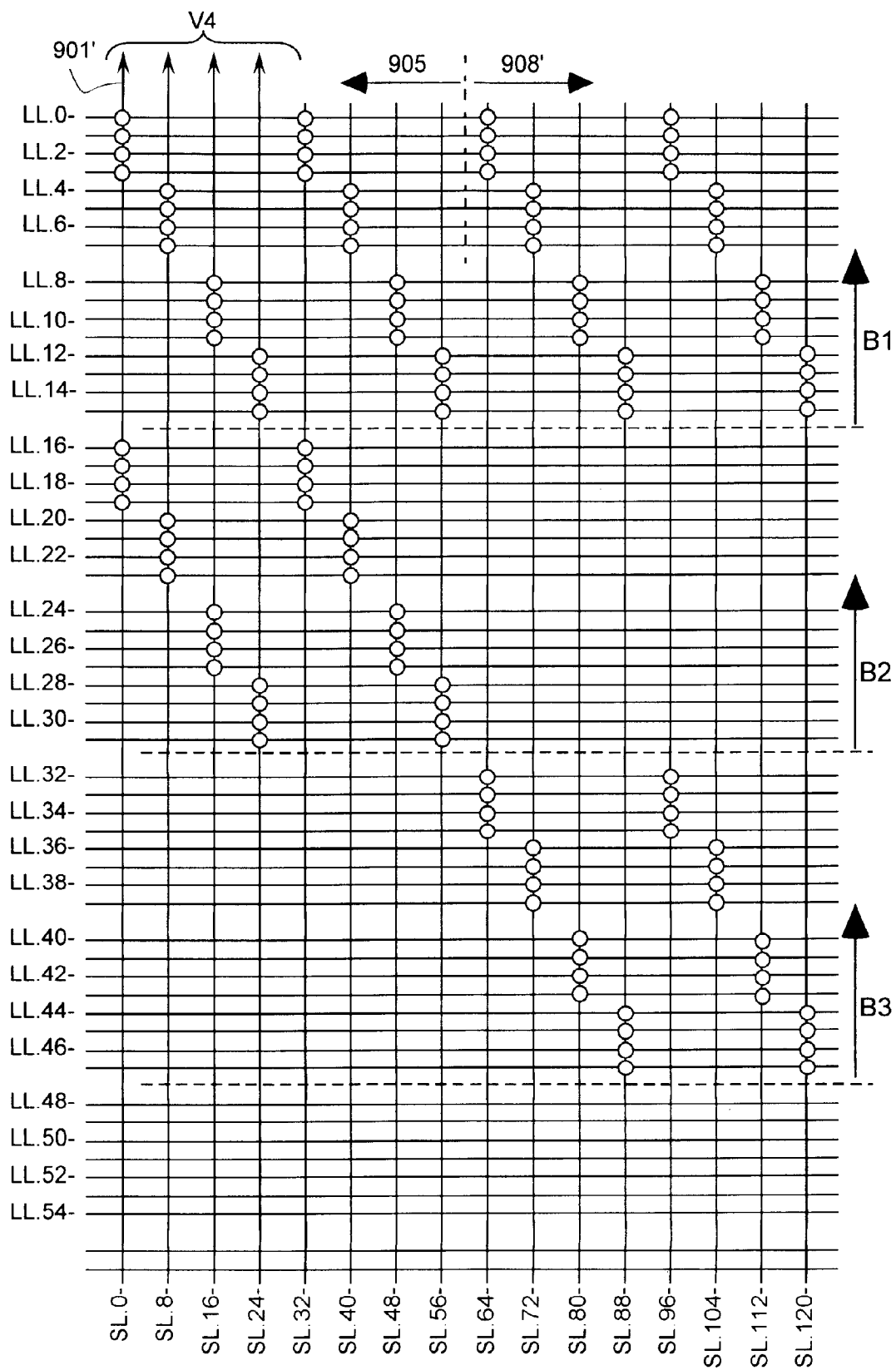
FIGS. 9C–9D are further schematics showing further details of a sliding bands scheme.

FIG. 9C shows a more microscopic view of one such, simplistic embodiment in which multiplexer 901' is defined by PIP's placed on the intersections of GSM shortline, SL.0 with GSM longlines LL.0 through LL.3 and LL.16 through LL.19. GSM shortline SL.0 extends to become a like-numbered longline of the corresponding SSM global section 552 (see FIG. 5).

In FIG. 9B, the V4 structure which includes multiplexer 901 is repeated one more time to thereby produce a generally-similar, second V4 structure that is referenced as 904 and has its respective distributions of 8 PIP's per SL, where the 8 PIP's are restricted to GSM output bands B1 and B2. The resulting V8 lines and PIP's (not shown) of these two V4 structures is referenced as 905. One, simplistic version of this V8 structure is shown as 905' in FIG. 9C and is seen to uniformly but partially, populate the intersections of GSM LL.0 through LL.31 with GSM shortlines, SL.0, SL.8, SL.16, SL.24, SL.32, SL.40, SL.48, and SL.56. Note that only every eighth shortline is shown here and that other shortlines, e.g., SL.1, SL.2, etc. populate the regions in between. The distribution of the band B1 and B2 PIP's on every eight line helps to space such B1/B2 populating PIP's apart from one another. PIP's that populate other bands, e.g., B3/B5 are interposed. See for example, SL.1 of FIG. 9D. This allows SL (shortlines) to be packed closely together without having the widths of respective PIP elements colliding into one another.

The next V8 structure in FIG. 9B is referenced as 908 and is seen to have PIP's that populate only GSM output bands B1 and B3. The next such V8 structure is then seen to populate only GSM output bands B2 and B4, and so on. Output bands B23 and B24 are covered by the last such V8 structure of the sequence.

In the version represented in FIG. 9C, the PIP's of the V8 multiplexing structure that covers output bands B1 and B3 are broadly referenced as 908'. Note that every eighth shortline is again shown here in the sequence SL.64 through SL.120.

Figure 9D:
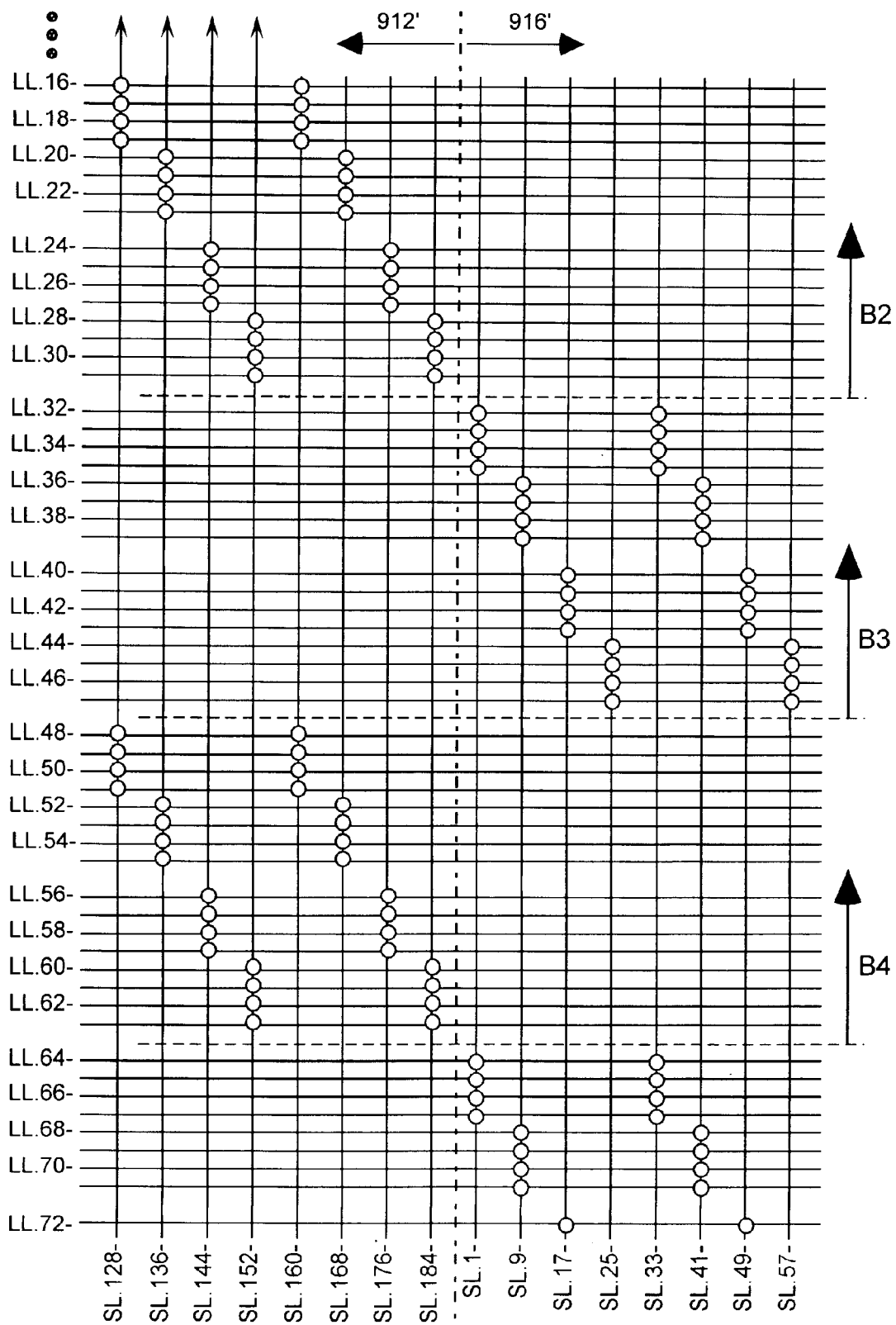
Figure 9E:
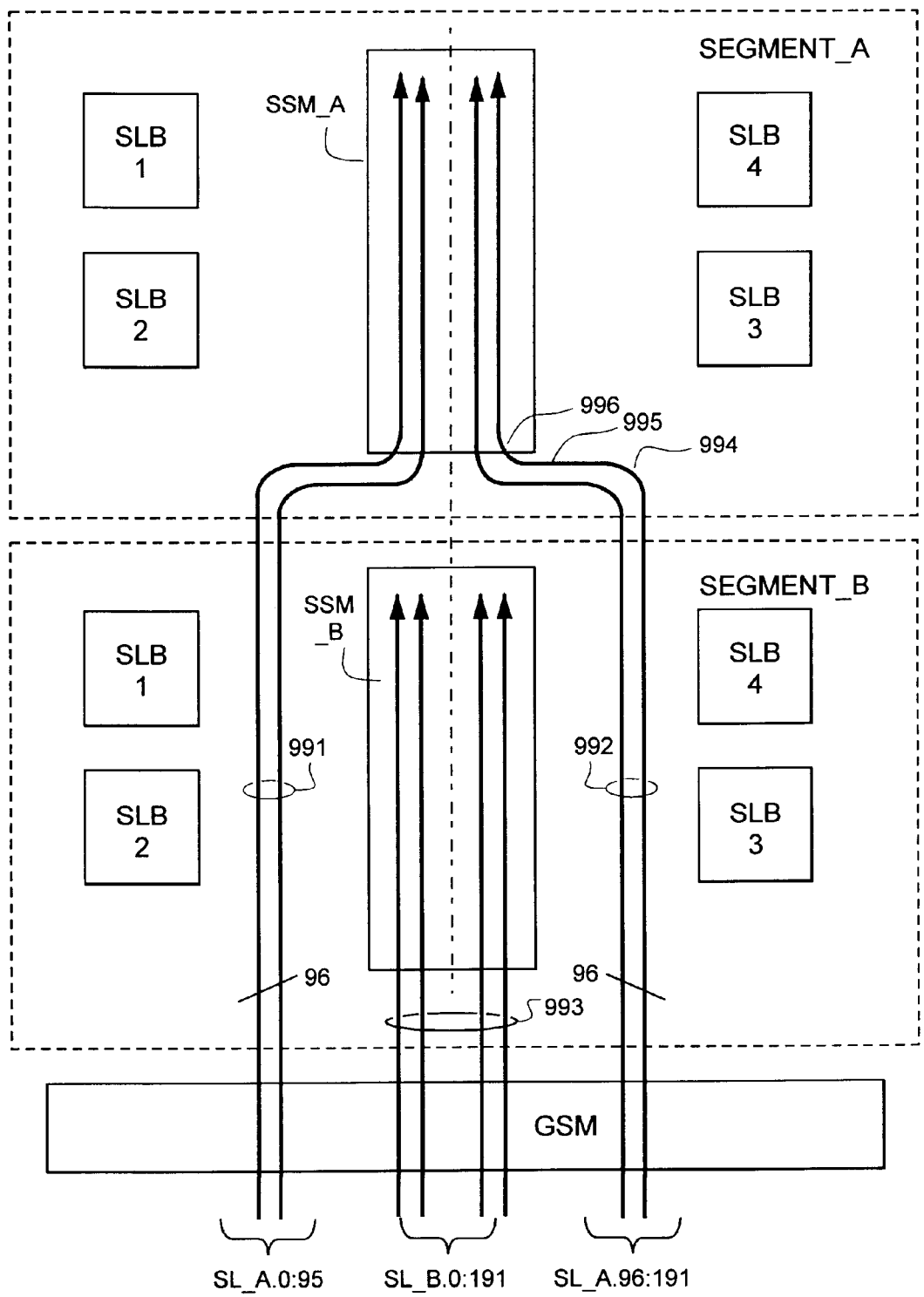
FIG. 9E is a schematic showing a technique for minimizing line length in the GSM to SSM couplings.

In the version continued in FIG. 9D, the PIP's of the V8 multiplexing structure that covers output bands B2 and B4 are broadly referenced as 912'. Note that every eighth shortline is again shown here in the sequence SL.128 through SL.184. After wrapping around beyond SL.191, the next unused shortline is SL.1, which begins the every-eighth shortlines sequence for the next V8 multiplexing structure that covers output bands B3 and B5. This set of PIP's is broadly referenced as 916'. It is understood that the general pattern continues in this manner to thereby intermingle the GSM sourcing points with the SSM signal-receiving lines.

The regularly-replicating pattern of PIP's which is shown in FIGS. 9C–9D turns out to be less-than ideal for routing randomly-defined connections between the GSM and a targeted SSM. By way of a very simple example, assume that a nibble-wide first signal (4 bits wide) appears on LL.0–LL.3 for transfer into the segment serviced by way of V8 multiplexers 905' and 908'. If the non-random PIP's placement of FIG. 9C is used, then the only opportunities for the 4 bits on LL.0–LL.3 to transfer into the segment via multiplexers 905' and 908' is on the four specific shortlines, SL.0, SL.32, SL.64 and SL.96. There is a finite probability however, that one or more of lines SL.0, SL.32, SL.64 and SL.96 have already been 'consumed' by the CPLD configuring software for transferring a GSM band B2 or B3 signal into the same segment. That finite probability can be disadvantageously enhanced by the possibility that another nibble of data is coming in longlines LL.16–LL.19 or LL.32–LL.35. In such a hypothetical case, the non-random repetition of 4 adjacent PIP's in each band increases the likelihood of contention for same shortlines (a collision). One of those N-bit wide signals will not be able to get through.

Referring again to FIG. 9B, consider now a more random, signal transference problem. Say there are 8 separate, GSM-sourced signals which are randomly assigned each to one of the 32 longlines of GSM output bands B1 and B2. The simplistic V8 structure 905' of FIG. 9C has 8 SL lines (vertical lines) for outputting such a supplied set of 8 sourced signals. But the V8 structure 905' is not fully populated with PIP's. There are 256 crosspoints (32×8) but only 64 PIP's. That's a populating percentage of only 25%. If we are lucky, the 8 sourced signals will come in a 'good' subset of longlines so that each one can get out by way of a respective one of the just 8 output lines. But what is the chance of that happening? Not very good. Stated more specifically, what are the chances that those 8 separate signals will distribute as 50% and 50% respectively across bands B1 and B2 so that the limited number and symmetrically-placed PIP's in the B1 and B2 parts of simplistic V8 structure 905' (FIG. 9C) can pick them up and output all of them?

With a little thought, it can be quickly appreciated that randomly disbursed ones of GSM-sourced signals are not likely to split exactly in numbers as 50% and 50% respectively across bands B1 and B2. Instead, the more likely outcome is that one of bands B1 and B2 will receive more than 50% while the other receives less. What will happen then if we shift the population distribution of PIP's in the simplistic V8 structure 905' of FIG. 9C so that, for some SL lines, band B1 has more PIP's than band B2, and so that, for some other SL lines, band B2 has more PIP's than band B1? That will help to relieve the band-overloading problem. In essence and conceptually speaking, PIP's are being slid from or borrowed from one band to the other. In practice, the PIP's do not slide. They are fixed to the location they are placed in. The sliding from one band to another occurs during the design stage, when we are considering where to fixedly place each PIP.

Because the disbursement of GSM-sourced signals is likely to be random, the conceptual sliding of PIP's from one band into another should also be random. PIP's patterning should be such that it improves the likelihood of successful routing into a target segment. Rather than having a regular patterning of PIP's, the better patterning approach tries to randomize the locations of PIP's both across GSM bands and within each GSM band so as to thereby minimize the likelihoods of routing collisions and/or band overloading. The total number of PIP's per SL line still remain as 8, but the number of PIP's per assigned, GSM output-band will vary from one SL line to the next.

Because the desired PIP's distribution is a random one, there is no easy way to show such a PIP's distribution pattern in the drawings. The human eye will not be able to discern a regular pattern such as that of the less-desirable, diagonal blocking pattern seen in FIGS. 9C–9D. Also, there is no one random distribution of PIP's that is better than all others.

The best way to describe the desired, PIP's distribution pattern is to explain that such patterns are to be typically generated by a computer program. The algorithm operates to provide the PIP placements with an orthogonal correlation between GSM longline numbers and shortline numbers. Consider for example, LL.0–LL.3 of FIG. 9C. Their PIP placements correlate 100% when any randomly-chosen two of longlines LL.0–LL.3 are tested.

Our goal is approach a 0% correlation for such pair-wise testings of PIP placements. If there is a PIP placed at the intersection of longline LL.a (a is an arbitrary number here between 0 and 32) and shortline SL.8, there should not be a PIP placed at the intersection of longline LL.b (b is an arbitrary, different number here between 0 and 32). Perfect, 0% correlation is not likely. Instead, we add up the correlation values for all permutations of longlines a and b and then seek a PIP's distribution pattern that minimizes that addition result.

The problem is symmetrical for shortlines or longlines. There are fewer shortlines per segment than longlines and thus the number of permutations to be considered is much less if we seek to minimize PIP placement intersections (matchings) and to maximize unions (non-matchings) in pair-wise considerations of all shortlines of a given segment.

More specifically, in FIG. 9C, the pair-wise intersections test for SL.0 and SL.32 will produce an outcome of 8 matches. That is an undesired result. If we slide one of the PIP's of SL.0 and SL.32 to a new position within bands B1 or B2, that will desirably reduce the matches outcome to 7. Contrastingly, the pair-wise intersections test for SL.0 and SL.8 will produce an outcome of 0 matches. That is a highly desired result. If we slide one of the PIP's of SL.0 and SL.8 to a new position within bands B1 or B2, that might undesirably increase the matches outcome from 0 to 1. The latter outcome is still much better than an 8.

The randomizing algorithm can operate as follows. One starts with a PIP's placement pattern that is chosen at random as a seed and conforms to the restriction of 8 PIP's per SL where the PIP's of each SL are confined to the assigned GSM-output bands of that SL. The pair-wise intersections tests for all unique permutations of SL.a and SL.b are carried out and the results are added and saved. Next a PIP slide is attempted and the intersections tests are repeated to see if the intersections sum has been reduced by the trial slide. If yes, it is kept and a next slide is tried. If no, it is generally discarded and a different slide is tried. Sometimes the algorithm may get 'stuck' if all non-improving slides are discarded. A subroutine keeps track of whether the inner loop has fallen into such a stuck mode. If yes, it instructs the inner loop to keep some of its bad slides in order to migrate out of the saddle area. Numerous algorithms of this kind are known in the art and thus do not have to be detailed here. The resulting PIP's placement should have a relatively minimized intersections sum and a relatively maximized unions sum. This will help to get random distributions of GSM global signals into the SSM of a desired segment.

While we have described the result as that of PIP's being slid from, or borrowed from, one. GSM output band to another, it is to be understood that each of the horizontally disbursed PIP's has a shortline associated with it. Thus, at the same time that a PIP is being conceptually 'slid' in the vertical direction to be loaned from one GSM output band to another, the corresponding shortline may be conceptualized as being 'slid' in the horizontal direction to be loaned from one GSM output band to another so that for a given locale, a particulary one GSM output band will have more shortlines than the average number of shortlines allocated per GSM output band and a competing GSM output band will have a fewer number of shortlines than the average number.

More specifically, FIG. 9B shows for example that a V8 structure such as 908 provides, on average, 4 shortlines per GSM band for routing the up-to-16 signals of each of its corresponding, H16, GSM output bands up to a respective SSM. Thus, on average, a V8 structure such as 908 provides 4 shortlines for GSM band OUT-B1 and 4 more 4 shortlines for GSM band OUT-B3.

Suppose, however, that one of the the corresponding, GSM output bands, let's say OUT-B3, is sourcing 5 or more signals for routing up to the respective SSM of exemplary V8 structure 908. Clearly, the average number of, 4 shortlines allocated to output band OUT-B3 cannot do the job. However, under the randomly sliding PIP's algorithm, there is a good likelihood that somewhere within the GSM-to-SSM crosspoints area, there will be a V8 structure such as exemplary 908, that will have borrowed additional shortlines from one of its GSM bands to thereby provide more than the average number of shortlines to the other of its GSM bands. The CPLD configuring software needs merely to locate such a V8 structure and use its above-average number of shortlines to route a like, above-average number of within-GSM-output-band signals to their targeted SSM.

Contrastingly, and for sake of efficiency, there may be another GSM output band, let's say OUT-B1, that is sourcing 3 or less signals for routing up to a targeted SSM. Clearly, the average number of, 4 shortlines allocated to output band OUT-B1 is more than enough to do the job. In fact, it is too much; and if so used, it will constitute a wastage of resources.

However, under the randomly sliding PIP's algorithm, there is a good likelihood that somewhere within the GSM-to-SSM crosspoints area, there will be a V8 structure such as exemplary 908, that will have loaned shortlines to another of its GSM bands to thereby provide less than the average number of shortlines for the lending GSM band. The CPLD configuring software may choose to locate such a V8 structure and use its below-average number of shortlines to route a like, below-average number of within-GSM-output-band signals to their targeted SSM. This will help to increase resource-usage efficiency and will assist in routing of signal groups that need an above-average number of shortlines to get to their targeted SSM.

Referring to FIG. 9E, another aspect of getting GSM global signals into the SSM of a desired segment has to do with wire lengths. In the embodiments of FIGS. 3B and 7C, the A segment is positioned directly above the B segment, D is below C, and so forth. A bundle of 192 wires has to be snaked from the GSM to the SSM of each respective segment. For SSM_B that is no problem. The wires (SL_B.0 through SL_B.191) can be extended vertically, directly up as a full bundle 993 from the GSM into SSM_B.

For SSM_A, however, the Segment Switch Matrix of segment B is in the way. The 192 wires for SSM_A may be snaked around as a full bundle by extending alongside SSM_A, then bending-in (994) and then bending-up (996) into SSM_A. The more preferred approach, however, splits the segment-feeding wires (SL_A.0 through SL_A.191) into two, equal-sized and symmetrical sub-bundles, 991 and 992. Sub-bundle 991 (SL_A.0 through SL_A.95) extends along the left side of SSM_B and then bends in and up to enter the left side of SSM_A. Sub-bundle 992 (SL_A.96 through SL_A.191) extends along the right side of SSM_B and then bends in as indicated at 995, extends horizontally by distance 995 and then bends up as indicated by 996 to enter the right side of SSM_A.

The split sub-bundles approach has the advantage that each 96-wire wide sub-bundle (991 and 992) extends horizontally, such as at extension 995, for a shorter distance than would have been needed if a full 192-wire wise bundle followed the same route. In the latter case, extension 995 would have had to stretch the full width of SSM_A whereas in the illustrated case it does not need to stretch more than half the width of SSM_A. Also, because the sub-bundles 991 and 992 are each narrower than a full bundle (e.g., 993), the average arc lengths of inward bends such as 994 and upward bends such as 996 tend to be smaller. Further, because the sub-bundles 991 and 992 are each narrower than a full bundle, separation between the SLB's and SSM's can be reduced. Thus, to the extent possible, wire lengths are minimized.

Referring back to FIG. 1, it is seen in a summarizing review of the above that a robust CPLD architecture has been disclosed for efficiently adapting to the control overhead needs, pinout needs, and speed requirements of designs whose parallel address and/or data paths are 16-bits wide, 32-bits wide, or 64-bits wide. Board level designs can be provided in which CPLD glue or other logic exhibits re-design Speed-Consistency, and/or re-design PinOut-Consistency, and/or the ability to implement in one pass, the generation of complex function signals. Such complex function signals can be expressed by the expressive form:

$$f_{SoP/PoS} = Sgn \cdot \Sigma^{N-5+} Xi \cdot (PTi^{Ki/Kmax/L1/(Q1)+L2/(Q2)}) \quad \{\text{Exp. B2}\}$$

where $f_{SoP/PoS}$ can be either a Boolean sum-of-products (SoP) or a Product of Sums (PoS) depending on whether the polarity controlling, sign value Sgn is a NOT function (−1) or a pass-through function (+1). In Exp. B2, the sum L1+L2 represents the number of longlines in the Segment Switch Matrix (SSM) of each segment. The number of SLB input lines that are provided for each of the plural SLB's of each segment is Kmax, and this number is at least 112.5%, and more preferably at least 125% of the expected, maximum and parallel, address and/or data path width (e.g., B=64-bits, B=96 bits, B=128 bits, etc.). The Level 1 number of interconnect lines, L1 is at least equal to the sum of the number of macrocell feedback signals (MFB's) and the number of I/O feedback signals (IFB's) produced by each SLB so as to provide 100% local connectivity. The Level 1 multiplexing factor, Q1 provides at least a 3-way routing flexibility at the local level, where such N-way routing flexibility equals Q1 times Kmax divided by L1. Further in Exp. B2, the number, L2 of global signals that can be fed from the GSM into each SSM is at least as large as L1 although L2 can be larger. This allows any first segment to forward all of its macrocell feedback signals (MFB's) and I/O feedback signals (IFB's) by way of the GSM to any second segment. The Level 2 multiplexing factor, Q2 provides at least a 3-way routing flexibility at the SSM to SLB interconnect level, where such N-way routing flexibility equals Q2 times Kmax divided by L2. CPLD configuring software is thereby given wide latitude in making routing choices both at the local and global interconnect levels.

The above disclosure is to be taken as illustrative of the invention, not as limiting its scope or spirit. Numerous modifications and variations will become apparent to those skilled in the art after studying the above disclosure.

By way of a first example, although FIGS. 3A–3B shows 8 segments, it is within the spirit of the invention to provide CPLD devices that have a fewer number or a larger number of segments. If a larger number of segments is used, then the design of the GSM should be changed (expanded) so that routability remains at 3-ways in or better for each GSM-feeding line such as 581 and so that all segments have symmetrical and uniform access to the GSM resources as is depicted in FIG. 7A.

By way of a second example, FIG. 5 can be modified to include, immediately after AND gates A163–A178, a plurality of up to sixteen, 1-to-2-of-N steering switches (see 431) that are programmable to steer the respective PT signal either to the OE terminal of the respective tristate driver 526 or to at least one, other wise programmably-specified control terminal, for example, selected ones of the OE controls of tristate longline drivers 586. If the PT output signal of such modified AND gates A163–A178 is steered away from the respective OE terminal, then the 1-to-2-of-N steering switch is further programmable to apply one or the other of an output enabling level (OE=1) or output disabling level (OE=0) to its respective tristate driver 526. Of course, by inserting such steering switches between AND gates A163–A178 and the OE terminals, the propagation time for OE-controlling PT's is increased and the size of the CPLD configuration memory is increased. Thus the design shown in FIG. 5 is faster and simpler.

By way of a third example, the OSM 570 in FIG. 5 can be modified to have more than 32 H-lines, where the additional H-lines (up to 32 more) are represented as 523 and receive respective MFB signals from one or more other SLB's. This allows SLB 510 to 'lend' or 'donate' its pads (516) for the outputting of result signals from the other SLB's if SLB 510 is not itself using such pads (516, buried or not) for the outputting of result signals. Of course, by inserting such additional pad sharing functionality, signal delays through the modified OSM and along lengthened MFB buses (522) may increase disadvantageously. Also, the size of the CPLD configuration memory will be increased to support the additional flexibility and the size of the IC die will increase commensurately. Thus the design shown in FIG. 5 is faster, smaller, simpler and cheaper to manufacture.

Given the above disclosure of general concepts and specific embodiments, the scope of protection sought is to be defined by the claims appended hereto.

What is claimed is:

1. A global switch matrix (GSM) for use within a programmably configurable integrated circuit (IC), where the IC has a first plurality, S of segments distributed within a logic-functions providing region of the IC, where each segment has one or more logic blocks, said global switch matrix providing programmably-definable interconnection between logic blocks of different ones of said segments and said GSM comprising:
   (a) a second plurality, L of longlines extending across the logic-functions providing region of the IC;
   (b) a third plurality, F of GSM-feeding lines crossing with the longlines and extending into the logic-functions providing region for coupling GSM-feed signals to the GSM, the GSM-feed signals including logic result signals produced by logic blocks of the S segments;
   (c) a fourth plurality, M of programmably-controllable multiplexers each having an output port and a fifth plurality, N of input receiving points, each input receiving point being operatively coupled to a respective one of the F GSM-feeding lines,
      (c.1) wherein the output port of each of the programmably-controllable multiplexers can be programmably switched between a high impedance state and an active state; and
      (c.2) wherein respective subsets of M/L of the M multiplexers are distributively disposed along and coupled to respective ones of the L longlines.
2. The global switch matrix of claim 1 wherein:
   (a.1) the second plurality, L is sufficiently large so that the L longlines can provide full intercoupling of logic result signals output from a first segment for input to a second segment and so that the L longlines can simultaneously provide full intercoupling of logic result signals output from the second segment for input to the first segment.
3. The global switch matrix of claim 2 wherein:
   (a.1a) each segment can output a sixth plurality, R of logic result signals and the second plurality, L is greater than two times R.
4. The global switch matrix of claim 3 wherein:
   (b.1) the GSM-feed signals further include input signals that are acquirable from outside the IC; and
   (a.1b) L is sufficiently large to carry not only two times R of said logic result signals but to also additionally carry a plurality of said input signals.
5. The global switch matrix of claim 4 wherein L is at least 384.
6. The global switch matrix of claim 1 wherein:
   (c.3) respective ones of the F GSM-feeding lines each couple to a plural number of said input receiving points, where the plural number of input receiving points are distributed amongst plural ones of the programmably-controllable multiplexers so that a given GSM-feed signal, on a respective one of the GSM-feeding lines, has more than one way of feeding into a longline of the GSM.
7. The global switch matrix of claim 1 wherein:
   (b.1) respective subsets of said F GSM-feeding lines that couple GSM-feed signals from respective but different ones of the segments are intertwined as the respective subsets of GSM-feeding lines cross with the longlines.
8. The global switch matrix of claim 1 wherein the GSM further comprises:
   (d) a sixth plurality, G of segment-feeding lines crossing with the longlines and extending into the logic-functions providing region for coupling GSM-sourced signals from the GSM to corresponding ones of the segments,
   (d.1) wherein respective subsets of said G segment-feeding lines that couple GSM-sourced signals to respective but different ones of the segments are intertwined as the respective subsets of segment-feeding lines cross with the longlines.
9. The global switch matrix of claim 8 wherein the GSM further comprises:
   (e) a seventh plurality, P of programmable interconnect points (PIP's) distributed at crosspoints of said longlines and said segment-feeding lines to implement a distributed multiplexing function for selectively coupling the GSM-sourced signals to respective but different ones of the segments;
      (e.1) wherein respective subsets of said P PIP's are distributed to partially populate the longlines and segment-feeding lines crosspoints in an on-average uniform manner but in a locally non-uniform and pseudo-randomly varying manner.
10. The global switch matrix of claim 9 wherein:
   (a.1) subsets of adjacent ones of the second plurality, L of longlines define a regular pattern of GSM output bands;
   (e.2) respective ones of the P PIP's that are distributed along a given, first segment-feeding line are restricted to occupying a first subset of plural ones of said GSM output bands;
   (e.3) respective other ones of the P PIP's that are distributed along a given, second segment-feeding line that is adjacent to the first segment-feeding line are restricted to occupying a second subset of plural ones of said GSM output bands that is mutually exclusive of said first subset of plural ones of said GSM output bands so that collision of widths of the PIP's on said adjacent first and second segment-feeding lines is avoided by virtue of their respective PIP's occupying mutually exclusive ones of the GSM output bands.

11. The global switch matrix of claim 1 wherein:

(a.1) said second plurality, L of longlines are constituted by metal lines each having a width of about $1.6\mu$ or more.

12. The global switch matrix of claim 11 wherein:

(a.2) said metal lines are further characterized by an inter-line spacing of about $0.5\mu$ or more.

13. The global switch matrix of claim 1 wherein:

(a.1) said second plurality, L of longlines are defined by metal lines each having a width substantially greater than a standard line width prescribed for metal lines of said IC, where the greater width of the metal lines defining the longlines operate to minimize dominance in defining the RC delay of the longlines by a resistance value R of the longlines while the greater width of the metal lines defining the longlines do not operate to allow a capacitance value C of the longlines to dominate said definition of the RC delay of the longlines.

14. A global switch matrix (GSM) for use within a programmably configurable integrated circuit (IC), where the IC has a first plurality, S of segments distributed within a logic-functions providing region of the IC, where each segment has one or more logic blocks, said global switch matrix providing programmably-definable interconnection between logic blocks of different ones of said segments and said GSM comprising:

(a) a second plurality, L of longlines extending across the logic-functions providing region of the IC;

(b) a third plurality, G of segment-feeding lines crossing with the longlines and extending into the logic-functions providing region for coupling GSM-sourced signals from the GSM to corresponding ones of the segments, (b.1) wherein respective subsets of said G segment-feeding lines that couple GSM-sourced signals to respective but different ones of the segments are intertwined as the respective subsets of segment-feeding lines cross with the longlines.

15. A monolithic, High-Density Complex Programmable Logic Device (HCPLD) for programmably implementing designs having parallel data words, said HCPLD having at least 64 I/O terminals for communicating with external circuitry, said HCPLD further comprising:

(a) a Global Switch Matrix (GSM);

(b) a plurality of logic-containing segments operatively coupled to the GSM; and (b.1) wherein each segment has a plurality of macrocells which feed respective macrocell output signals directly to the GSM; and (a.1) the GSM is sufficiently wide and each segment further has, as dedicated for inter-segment communications, at least as many longlines as there are macrocells in each of the plural segments, to thereby assure that every macrocell signal (MFB) of a first segment can be simultaneously transmitted through the GSM from the first segment to another of the plural segments.

16. A computer-implemented method for assigning respective ones of programmable interconnect points (PIP's) for partially-populating disposition at crosspoints of longlines and shortlines to thereby implement a distributed multiplexing function for selectively coupling longline-sourced signals to respective but different ones of the shortlines and wherein respective subsets of said PIP's are to be distributed to partially populate the longline and shortline crosspoints in an on-average uniform manner but in a locally non-uniform and pseudo-randomly varying manner, said method comprising:

(a) dividing the long lines into bands;

(b) initially distributing PIP locations in assigned pairs of bands for each of the shortlines;

(c) performing pair-wise, PIP-placement intersections tests for all unique permutations of comparable first and second shortlines (SL.a and SL.b);

(d) added and saving correlation results from the pair-wise testings of PIP placements of step (c);

(e) attempting a PIP-placement slide between bands;

(f) repeating the PIP-placement intersections tests for all unique permutations of the comparable first and second shortlines after the slide;

(g) adding the correlation results from the pair-wise testings of step (f) and comparing them against the saved results;

(h) identifying the results with lower correlation value, keeping the PIP placements associated with the identified lower correlation value, and defining as the saved results, the results associated with the identified lower correlation value; and (i) repeating steps (e) through (h) until a PIP placements arrangement with a relatively minimized correlation value is found.

* * * * *